(12) United States Patent
Park et al.

(10) Patent No.: US 11,869,582 B2
(45) Date of Patent: Jan. 9, 2024

(54) NON-VOLATILE MEMORY DEVICE AND METHOD OF INCREMENTALLY PROGRAMMING THE SAME USING A PLURALITY OF PROGRAM LOOPS

(71) Applicant: SAMSUNG ELECTRONICS CO., LTD., Suwon-si (KR)

(72) Inventors: Jiyoon Park, Suwon-si (KR); Sungwon Yun, Hwaseong-si (KR); Hyunjun Yoon, Changwon-si (KR); Wontaeck Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 17/510,828

(22) Filed: Oct. 26, 2021

(65) Prior Publication Data

US 2022/0172775 A1    Jun. 2, 2022

(30) Foreign Application Priority Data

Dec. 1, 2020    (KR) .................... 10-2020-0166003

(51) Int. Cl.
    *G11C 16/04*    (2006.01)
    *G11C 11/56*    (2006.01)
    (Continued)

(52) U.S. Cl.
    CPC ...... *G11C 11/5628* (2013.01); *G11C 11/5671* (2013.01); *G11C 16/0483* (2013.01);
    (Continued)

(58) Field of Classification Search
    CPC ............ G11C 11/5628; G11C 11/5671; G11C 16/0483; G11C 16/10; G11C 16/3459;
    (Continued)

(56) References Cited

U.S. PATENT DOCUMENTS 7,800,946 B2    9/2010 Kim et al.
7,839,690 B2 *    11/2010 Lee .................... G11C 11/5635
                                                        365/185.24
(Continued)

FOREIGN PATENT DOCUMENTS

KR          10-0705219          3/2007
KR       10-2010-0056860        5/2010
(Continued)

*Primary Examiner* — Tha-O H Bui
(74) *Attorney, Agent, or Firm* — F. CHAU & ASSOCIATES, LLC

(57) ABSTRACT

A method of operating a memory device that performs a plurality of program loops for a plurality of memory cells includes applying a first program pulse and a first verify pulse of a first program loop from among the plurality of program loops, counting a first off cell count by using an output based on the first verify pulse, determining a first verify skip period using the first off cell count, applying an N-th program pulse and a plurality of verify pulses in response to an end of the first verify skip period, counting a second off cell count by using an output based on the plurality of verify pulses, and determining a second verify skip period using the second off cell count.

20 Claims, 19 Drawing Sheets

(51) Int. Cl.
  *G11C 16/10* (2006.01)
  *G11C 16/34* (2006.01)
  *H01L 25/18* (2023.01)
  *H01L 23/00* (2006.01)
  *H01L 25/065* (2023.01)

(52) U.S. Cl.
  CPC .......... *G11C 16/10* (2013.01); *G11C 16/3459* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
  CPC ... G11C 7/04; G11C 2211/5641; G11C 16/08; G11C 16/32; G11C 16/3404; G11C 5/147; G11C 16/30; H01L 24/08; H01L 25/0657; H01L 25/18; H01L 2224/08145; H01L 2924/1431; H01L 2924/14511
  USPC .................................................... 365/185.03
  See application file for complete search history.

(56) References Cited

U.S. PATENT DOCUMENTS

| | | | |
|---|---|---|---|
| 8,174,895 B2 | 5/2012 | Chen et al. | |
| 8,539,138 B2* | 9/2013 | Kim | G11C 16/3454 |
| | | | 711/103 |
| 8,837,223 B2 | 9/2014 | Sakamoto et al. | |
| 9,728,279 B2* | 8/2017 | Yim | G11C 16/10 |
| 9,779,833 B2 | 10/2017 | Joo et al. | |
| 9,792,999 B2 | 10/2017 | Lee et al. | |
| 9,953,703 B2* | 4/2018 | Hahn | G11C 16/0466 |
| 10,366,769 B2* | 7/2019 | Cho | G11C 16/10 |
| 10,438,666 B2* | 10/2019 | Park | G11C 16/3445 |

FOREIGN PATENT DOCUMENTS

| | | |
|---|---|---|
| KR | 10-0965076 | 6/2010 |
| KR | 10-1699917 | 1/2017 |

* cited by examiner

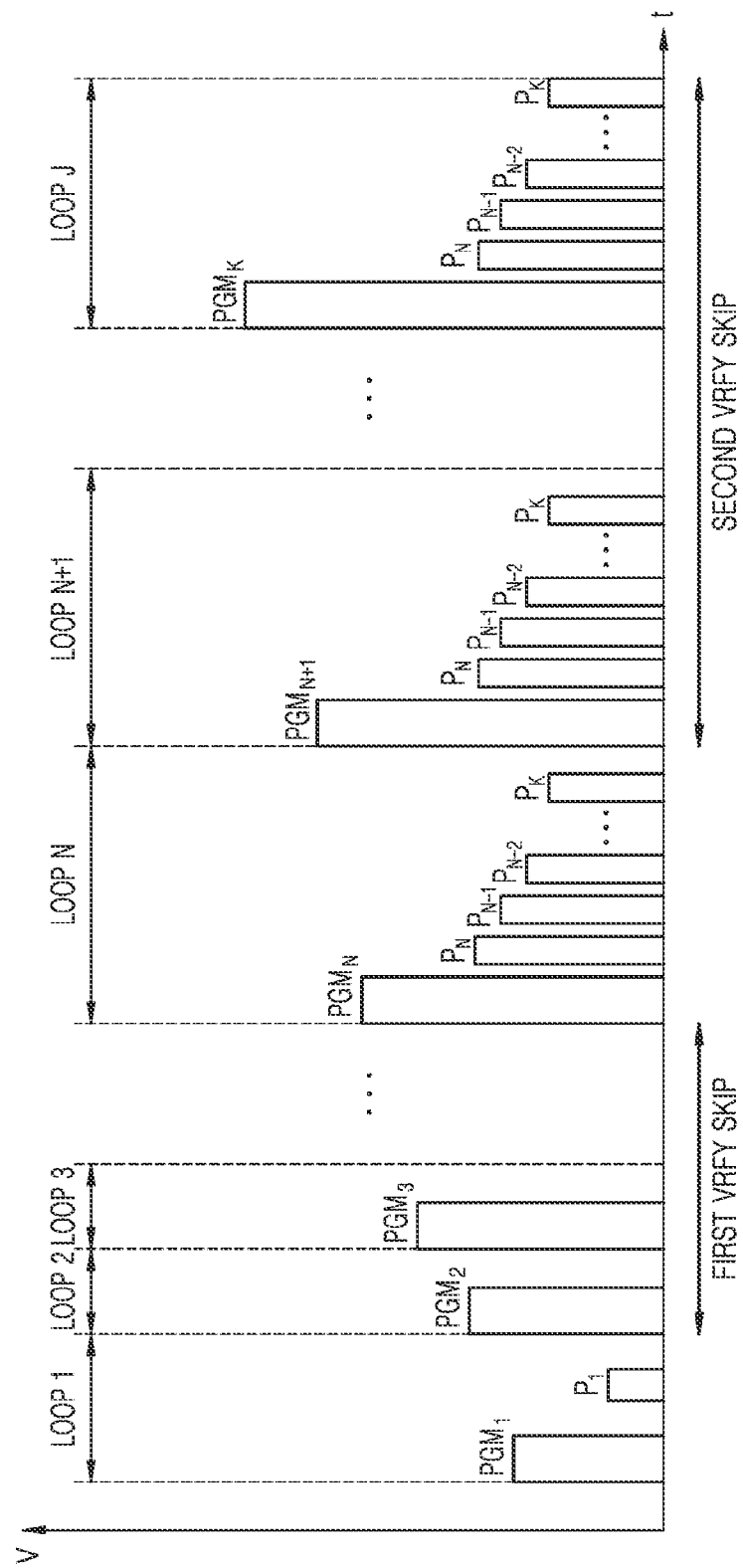

NON-VOLATILE MEMORY DEVICE AND METHOD OF INCREMENTALLY PROGRAMMING THE SAME USING A PLURALITY OF PROGRAM LOOPS

CROSS-REFERENCE TO RELATED APPLICATION

This application claims priority under 35 U.S.C. § 119 to Korean Patent Application No. 10-2020-0166003, filed on Dec. 1, 2020 in the Korean Intellectual Property Office, the disclosure of which is incorporated by reference herein in its entirety.

TECHNICAL FIELD

Embodiments of the inventive concept relate to a method of programming a non-volatile memory device.

DISCUSSION OF RELATED ART

Semiconductor memory devices may be classified into volatile memories like dynamic random-access memory (DRAM) or static RAM (SRAM) and non-volatile memories like electrically erasable programmable read-only memory (EEPROM), ferroelectric RAM (FRAM), phase-change RAM (PRAM), magnetic RAM (MRAM), or flash memory. A volatile memory device loses data stored therein when the power supply is cut off, whereas a non-volatile memory device retains data stored therein even when the power supply is cut off.

Devices using non-volatile memory include, for example, MP3 players, digital cameras, mobile phones, camcorders, flash cards, and solid state disks (SSDs). As the number of devices that use non-volatile memories as storage devices increases, the capacity of non-volatile memories is also rapidly increasing.

As a programming method, a program operation according to an increment step pulse program (ISPP) method may be used, and, after a program voltage pulse is provided to memory cells, the program state of the memory cells may be verified by using a verify voltage or pulse. However, as the number of stored bits per memory cell increases, the number of verify pulses applied in each loop of the ISPP increases, and thus performance degradation that increases the total program time may occur.

SUMMARY

According to an embodiment of the inventive concept, a method of operating a memory device that performs a plurality of program loops for a plurality of memory cells includes applying a first program pulse and a first verify pulse of a first program loop from among the plurality of program loops, counting a first off cell count by using an output based on the first verify pulse, determining a first verify skip period based on the first off cell count, applying an N-th program pulse and a plurality of verify pulses in response to an end of the first verify skip period, counting a second off cell count by using an output based on the plurality of verify pulses, and determining a second verify skip period using the second off cell count.

According to an embodiment of the inventive concept, a memory device includes a memory cell array including a plurality of memory cells, and a control logic circuit configured to perform a plurality of program loops for the plurality of memory cells. The control logic circuit includes an off cell counting circuit configured to identify a number of off cells based on at least one verify pulse, a verify skip period manger circuit configured to determine a length of a verify skip period based on the number of off cells or a critical value, and a step voltage manager circuit configured to determine a magnitude of a step voltage for the plurality of program loops at least based on the number of off cells.

According to an embodiment of the inventive concept, a memory device includes a memory cell region including a first metal pad, a peripheral circuit region including a second metal pad and configured to be connected in a vertical direction to the memory cell region through the first metal pad and the second metal pad, a memory cell array including a plurality of memory cells including a plurality of strings extending in a vertical direction with respect to a substrate in the memory cell region, and a control logic circuit configured to apply a first program pulse and a first verify pulse in a first program loop of a plurality of program loops in the peripheral circuit region, count the number of first off cells by using an output based on the first verify pulse, determine a first verify skip period based on the number of first off cells, apply an N-th program pulse and a plurality of verify pulses in response to termination of the first verify skip period, count a number of second off cells by using an output based on the plurality of verify pulses, and determine a second verify skip period based on the number of second off cells.

BRIEF DESCRIPTION OF THE DRAWINGS

The above and other features of the inventive concept will be more clearly understood by describing in detail embodiments thereof with reference to the accompanying drawings.

FIG. 8B is a graph illustrating the method of FIG. 8A according to an embodiment of the inventive concept.

DETAILED DESCRIPTION OF THE EMBODIMENTS

Embodiments of the inventive concept provide a non-volatile memory device capable of executing a program operation with improved performance and a method of programming the same.

Embodiments of the inventive concept will be described with a NAND flash memory as an example of a non-volatile memory device. However, the inventive concept is not limited to a NAND flash memory, and may be applied to various non-volatile memory devices like an electrically erasable programmable read-only memory (EEPROM), a NOR flash memory device, a phase-change RAM (PRAM), a resistive RAM (RRAM), a ferroelectric RAM (FRAM), a magnetic RAM (MRAM), a spin-transfer torque MRAM, a conductive bridging RAM (CBRAM), a nanotube RAM, a polymer RAM (PoRAM), a nano floating gate memory (NFGM), a holographic memory, a molecular electronics memory, an insulator resistance change memory, etc.

Figure 1:
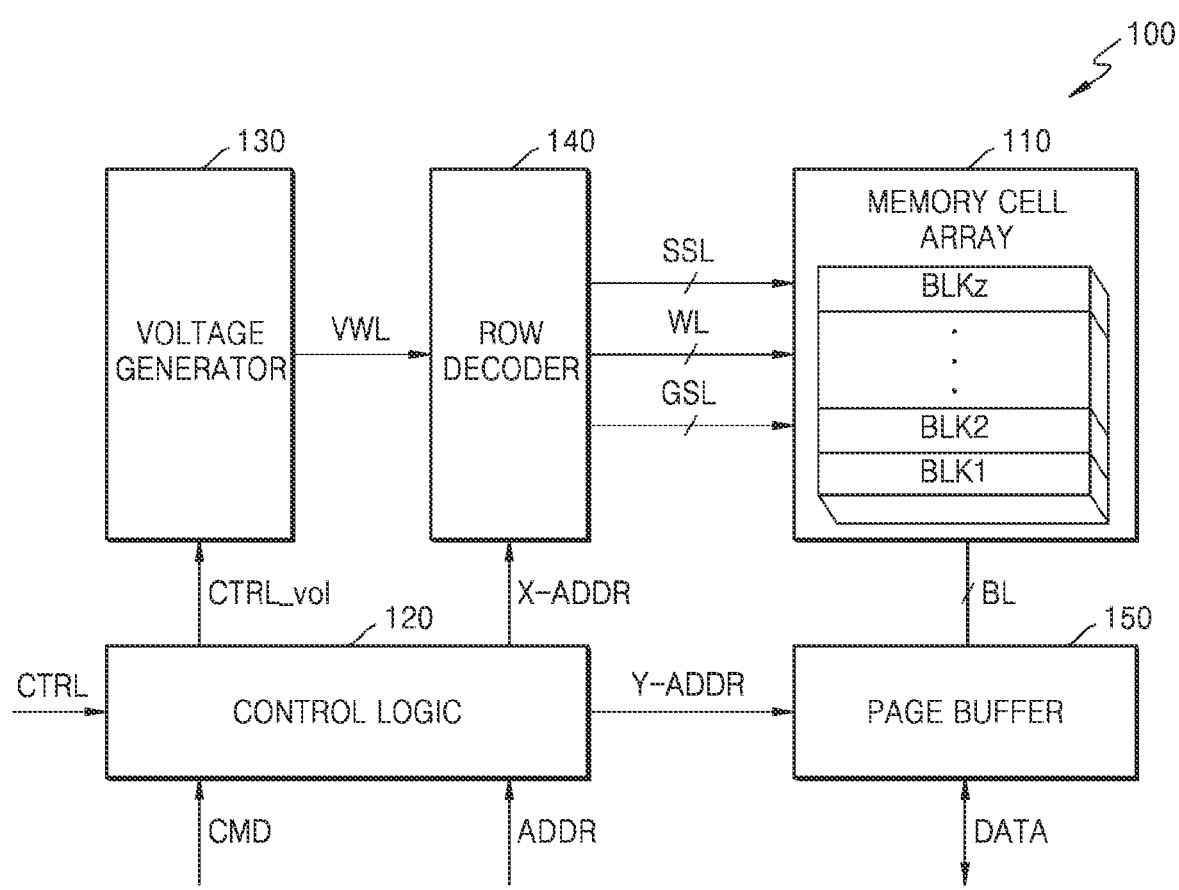
FIG. 1 is a block diagram showing a non-volatile memory device according to an embodiment of the inventive concept.

FIG. 1 is a block diagram showing a non-volatile memory device according to an embodiment of the inventive concept.

Referring to FIG. 1, a memory device 100 may include a memory cell array 110, a control logic 120, a voltage generator 130, a row decoder 140, and a page buffer 150. The memory device 100 may further include a data input/output circuit or an input/output interface.

The memory cell array 110 may include a plurality of memory cells and may be connected to a plurality of word lines WL, a plurality of string select lines SSL, a plurality of ground select lines GSL, and a plurality of bit lines BL. In detail, the memory cell array 110 may be connected to the row decoder 140 through the word lines WL, the string select lines SSL, and the ground select lines GSL and may be connected to the page buffer 150 through the bit lines BL.

The memory cell array 110 may include a plurality of memory blocks BLK1 to BLKz. For example, the memory blocks BLK1 to BLKz may each have a 3-dimensional structure (or a vertical structure). In detail, each memory block includes structures extending in first to third directions. For example, each memory block includes a plurality of NAND strings (hereinafter referred to as 'strings') extending in the third direction. In this case, the strings may be spaced apart from one another by a particular distance in the first and second directions. The memory blocks BLK1 to BLKz may be selected by the row decoder 140. For example, the row decoder 140 may select a memory block corresponding to a block address from among the memory blocks BLK1 to BLKz.

Memory cells included in the memory cell array 110 may each store at least two or more bits. For example, a memory cell may be a multi-level cell (MLC) that stores 2-bit data. In another example, a memory cell may be a triple level cell (TLC) that stores 3-bit data. In another example, a memory cell may be a quad level cell (QLC) that stores 4-bit data. However, the inventive concept is not limited thereto, and, in an embodiment of the inventive concept, some memory cells included in the memory cell array 110 may be single level cells (SLC) each storing 1-bit data and some other memory cells may be MLCs.

Hereinafter, for convenience of explanation, descriptions will be given under an assumption that a memory cell according to an embodiment of the inventive concept corresponds to a QLC.

The plurality of memory blocks BLK1 to BLKz may include at least one of a SLC block including SLCs, an MLC block including MLCs, a TLC block including TLCs, and a QLC block including QLCs. Some of a plurality of memory blocks included in the memory cell array 110 may be SLC blocks, and the other memory blocks may be MLC blocks or TLC blocks.

When an erase voltage is applied to the memory cell array 110, the memory cells enter an erase state. When a program pulse is applied to the memory cell array 110, the memory cells enter a program state. In this case, each memory cell may be in an erase state or at least one program state classified according to a threshold voltage Vth.

Memory cells in an erased state may be programmed based on a pre-set program pulse in correspondence to a program state, and then be classified into a plurality of cell groups according to program speeds based on a Gaussian-type threshold voltage distribution of the memory cells. For example, when a memory cell is a QLC programmed to 4 bits, the memory cell may have an erase state or one of first to fifteenth program states.

The control logic 120 may output various control signals for writing data to the memory cell array 110 or reading data from the memory cell array 110 based on a command CMD, an address ADDR, and a control signal CTRL received from a memory controller. Therefore, the control logic 120 may overall control various operations within the memory device 100. In an embodiment of the inventive concept, when programming a plurality of memory cells, a plurality of program loops may be sequentially performed, and the control logic 120 may control various operations in the memory device 100, such that the program loops are performed. According to an embodiment of the inventive concept, the control logic 120 may be a circuit.

Various control signals output from the control logic 120 may be provided to the voltage generator 130, the row decoder 140, and the page buffer 150. The control logic 120 may provide a voltage control signal CTRL_vol to the voltage generator 130. In an embodiment of the inventive concept, the control logic 120 may generate the voltage control signal CTRL_vol for controlling generation of a program pulse and a verify voltage to be provided to the memory cell array 110 to write data to memory cells.

The control logic 120 may control the voltage generator 130 to generate at least one verify voltage and at least one program pulse in each program loop, and the control logic 120 may control the voltage generator 130 to generate a program pulse whose level is changed as the count of program loops increases. For example, as the count of program loops increases, the control logic 120 may control the voltage generator 130 to generate a program pulse having a level increased by a step voltage.

The voltage generator 130 may generate various types of voltages for performing a program operation, a read operation, and an erase operation on the memory cell array 110 based on the voltage control signal CTRL_vol. The voltage generator 130 may generate a word line voltage VWL, e.g., a program pulse and a verify voltage.

In an embodiment of the inventive concept, the voltage generator 130 may generate a program pulse and a verify voltage whose levels are changed as the count of program loops increases based on the voltage control signal CTRL_vol. When a program loop is being performed, a programming method according to an embodiment of the inventive concept may be performed according to an incremental step pulse programming (ISPP) scheme, and the voltage generator 130 may generate a program pulse whose level is increased by a step pulse from that of a previous program pulse.

The row decoder 140 may select some of word lines WL in response to a row address X-ADDR received from the control logic 120. In detail, during a program operation, the row decoder 140 may provide a program pulse to a selected word line. Additionally, in response to the row address X-ADDR received from the control logic 120, the row decoder 140 may select some of the string select lines SSL or some of the ground select lines GSL. The row decoder 140 may receive at least one verify voltage and at least a program pulse for each program loop from the voltage generator 130 and provide them to word lines of a plurality of memory cells.

The page buffer 150 may be connected to the memory cell array 110 through the bit lines BL and may select some of the bit lines BL in response to a column address Y-ADDR received from the control logic 120. During a read operation, the page buffer 150 may operate as a sense amplifier to sense data DATA stored in the memory cell array 110. Meanwhile, during a program operation, the page buffer 150 may operate as a write driver to input data DATA to be stored in the memory cell array 110.

The page buffer 150 may store the data DATA read from the memory cell array 110 or may store the data DATA to be written to the memory cell array 110. For example, when a verify voltage is applied, the page buffer 150 may temporarily store the number of off cells.

When the row decoder 140 applies a program pulse to a selected word line during a program operation, the page buffer 150 may apply a bit line voltage like a program inhibit voltage or a program voltage to the bit lines BL according to a speed at which memory cells are programmed.

Figure 2:
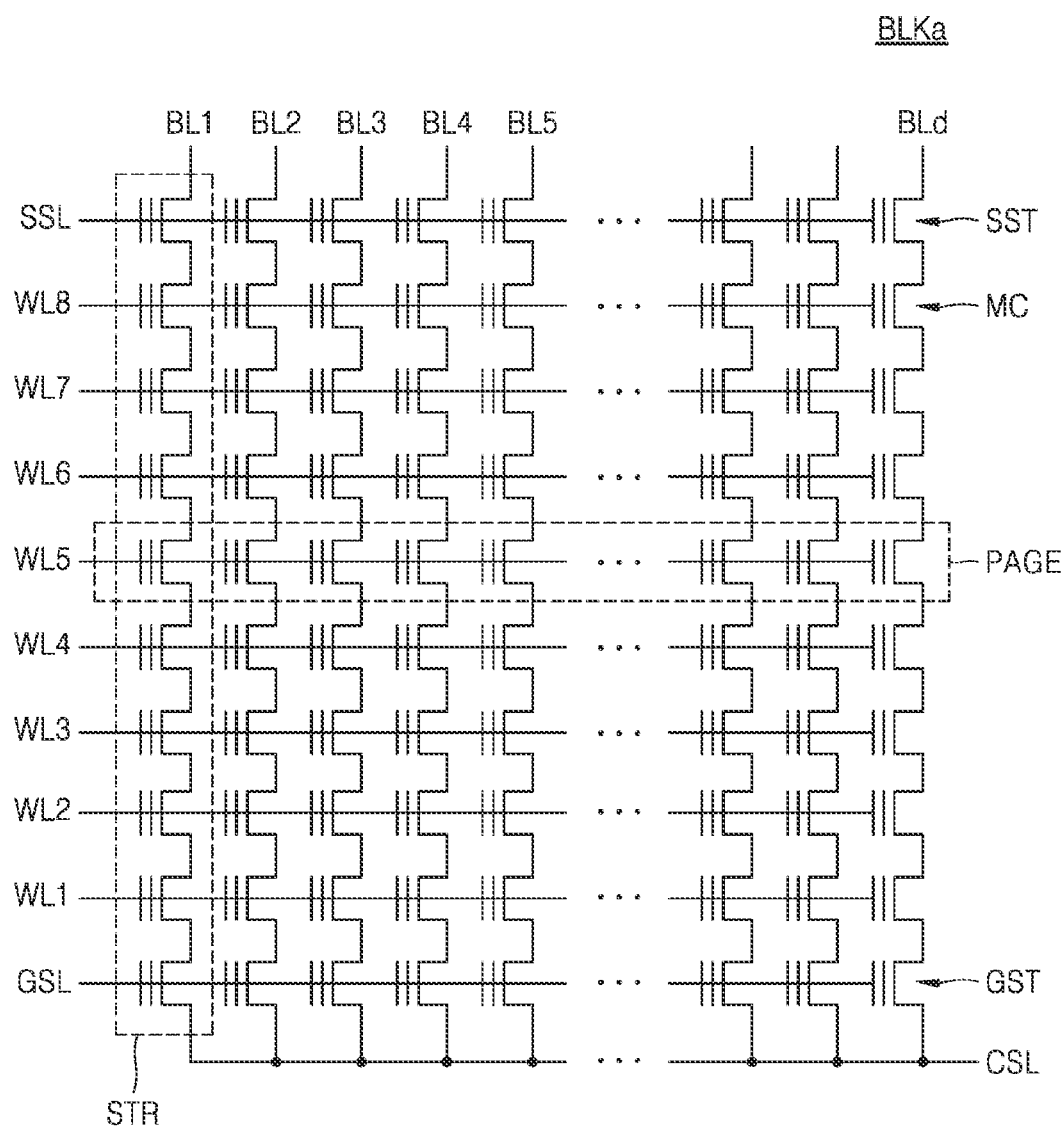
FIG. 2 is a circuit diagram showing a memory block according to an embodiment of the inventive concept.

FIG. 2 is a circuit diagram showing a memory block according to an embodiment of the inventive concept.

Referring to FIG. 2, a memory block BLKa may be a horizontal NAND flash memory. The memory block BLKa may include d (where d is an integer greater than or equal to 2) strings STR to which 8 memory cells are connected in series. Each string STR may include a string select transistor SST and a ground select transistor GST connected to both ends of memory cells MC connected in series via one of a plurality of bit lines BL1 to BLd. Here, the number of the strings STR, the number of the word lines WL, and the number of the bit lines BL may vary according to embodiments of the inventive concept.

In a NAND flash memory device including a memory block having a structure as shown in FIG. 2, an erase operation may be performed memory block by memory block, and a program operation may be performed page by page corresponding to each of word lines WL1 to WL8. In an embodiment of the inventive concept, when the memory cell MC is a SLC, one page PAGE may correspond to each word line. In an embodiment of the inventive concept, when the memory cell MC is a MLC, a TLC, or a QLC, a plurality of pages may correspond to each word line. For example, when the memory cell MC is a QLC, each word line may correspond to a least significant bit (LSB) page, an extrinsic significant bit (ESB) page, an upper significant bit (USB) page, and a most significant bit (MSB) page.

Figure 3:
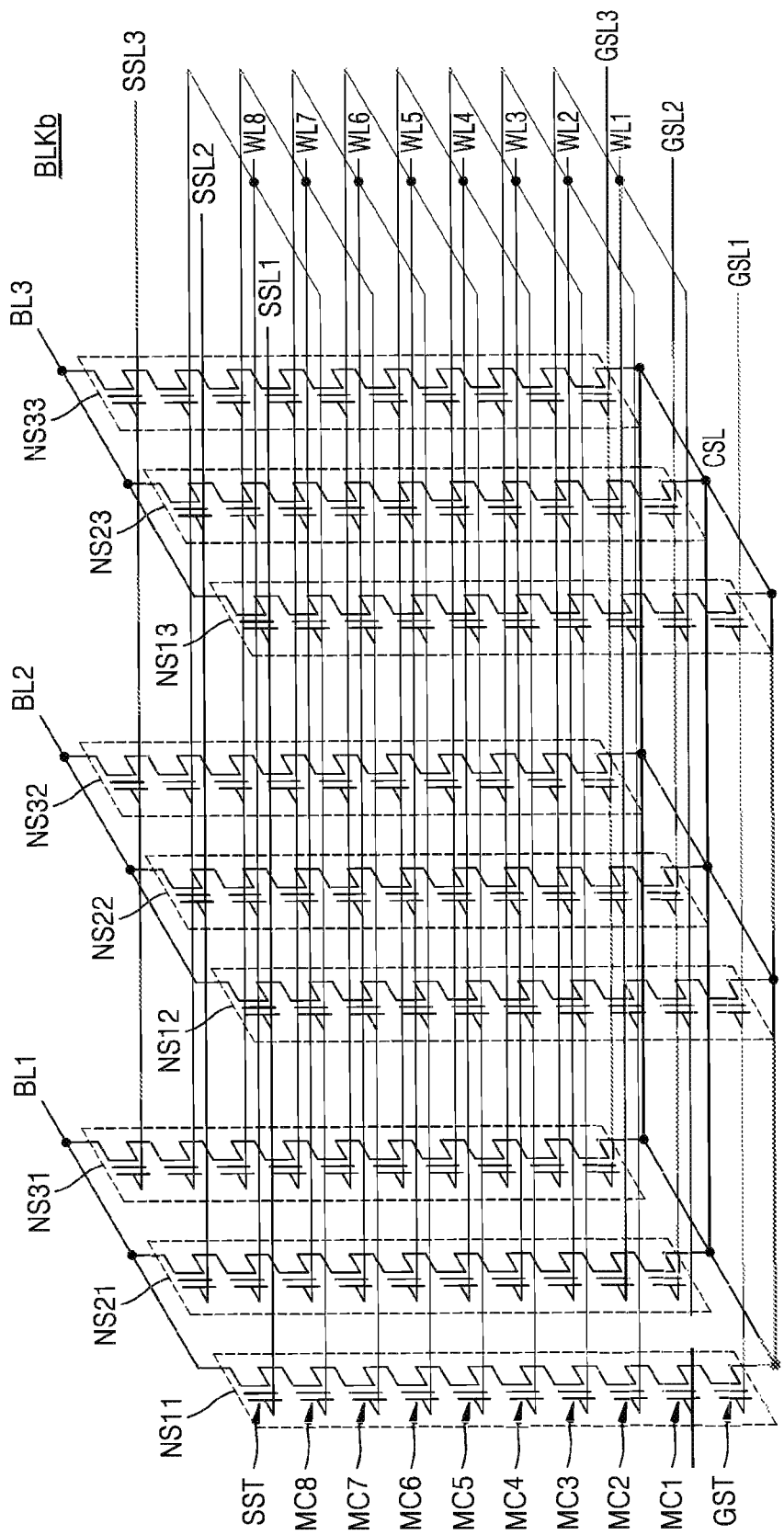
FIG. 3 is a circuit diagram showing a memory block according to an embodiment of the inventive concept.

FIG. 3 is a circuit diagram showing a memory block according to an embodiment of the inventive concept.

Referring to FIG. 3, a memory block BLKb may be a vertical NAND flash memory. The memory block BLKb may include a plurality of NAND strings NS11 to NS33, a plurality of word lines WL1 to WL8, a plurality of bit lines BL1 to BL3, a plurality of ground select lines GSL1, GSL2, and GSL3, a plurality of string select lines SSL1 to SSL3, and a common source line CSL. Here, the number of NAND strings, the number of word lines, the number of bit lines, the number of ground select lines, and the number of string select lines may vary according to embodiments of the inventive concept.

NAND strings NS11, NS21, and NS31 are provided between a first bit line BL1 and the common source line CSL, NAND strings NS12, NS22, and NS32 are provided between a second bit line BL2 and the common source line CSL, and NAND strings NS13, NS23, and NS33 are provided between a third bit line BL3 and the common source line CSL. Each NAND string (e.g., NS11) may include the string select transistor SST, a plurality of memory cells MC1 to MC8, and the ground select transistor GST that are coupled in series. Hereinafter, for convenience of explanation, a NAND string will be referred to as a string.

Strings commonly coupled to one bit line constitute one column. For example, the strings NS11, NS21, and NS31 commonly coupled to the first bit line BL1 may correspond to a first column, the strings NS12, NS22, and NS32 commonly coupled to the second bit line BL2 may correspond to as second column, and the strings NS13, NS23, and NS33 commonly coupled to the third bit line BL3 may correspond to a third column.

Strings coupled to one string select line constitute one row. For example, strings NS11, NS12, and NS13 coupled to a first string select line SSL1 may correspond to a first row, strings NS21, NS22, and NS23 coupled to a second string select line SSL2 may corresponds to a second row, and strings NS31, NS32, and NS33 coupled to a third string select line SSL3 may correspond to a third row.

The string select transistor SST is coupled to the string select lines SSL1 to SSL3. The memory cells MC1 to MC8 are coupled to corresponding word lines WL1 to WL8, respectively. The ground select transistors GST are coupled to the ground select lines GSL1, GSL2, and GSL3. The string select transistors SST are each connected to a corresponding bit line BL, and the ground select transistors GST are connected to the common source line CSL.

Figure 4:
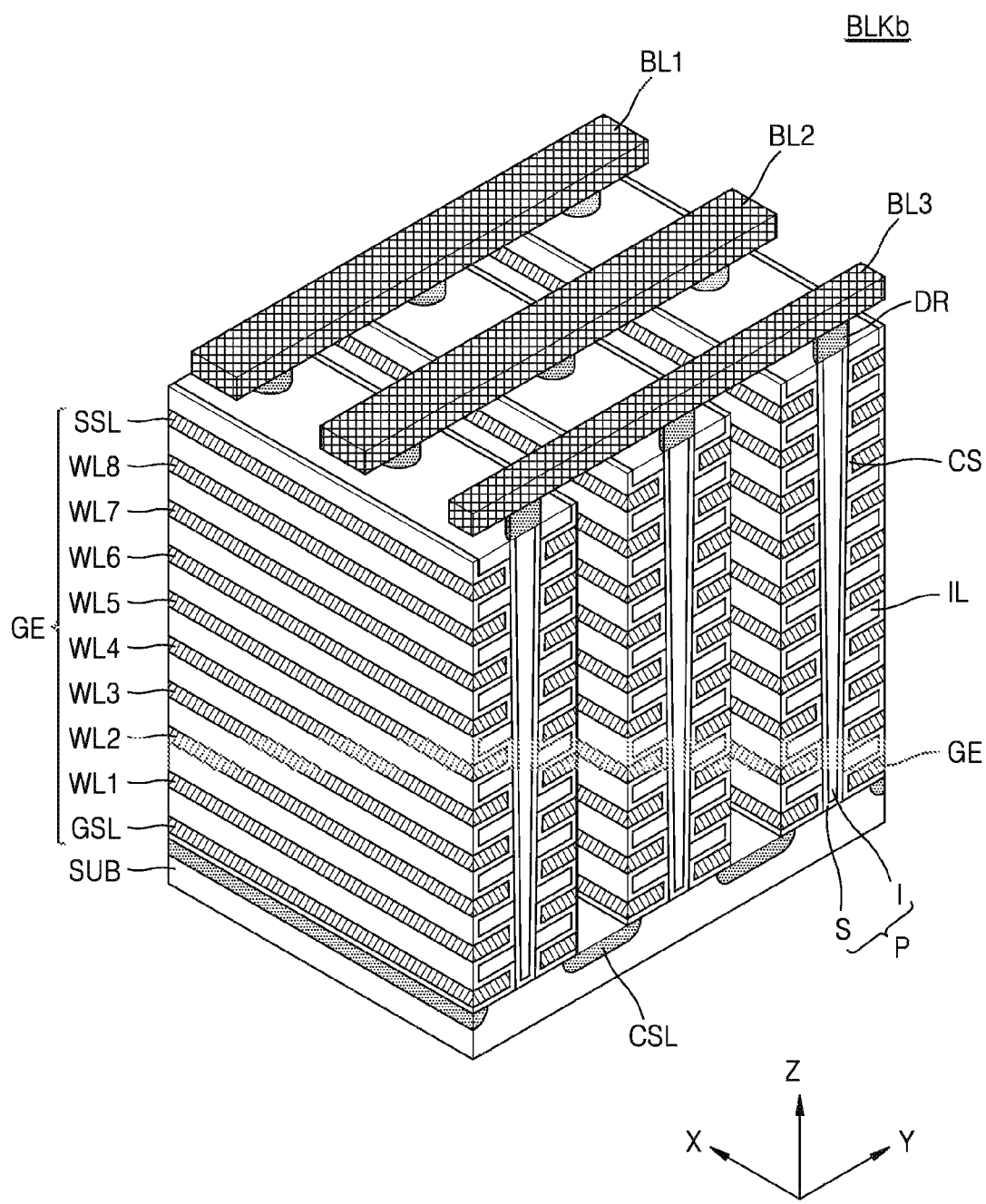
FIG. 4 is a perspective view of a memory block according to the circuit diagram of FIG. 3 according to an embodiment of the inventive concept.

Word lines (e.g., WL1) of substantially the same height are connected in common, and the string select lines SSL1 to SSL3 are separated from one another. For example, when programming memory cells coupled to a first word line WL1 and belonging to the strings NS11, NS12, and NS13, the first word line WL1 and the first string select line SSL1 may be selected. In an embodiment of the inventive concept, as shown in FIG. 4, the ground select lines GSL1, GSL2, and GSL3 may be separated from one another. In an embodiment of the inventive concept, the ground select lines GSL1, GSL2, and GSL3 may be connected to one another.

FIG. 4 is a perspective view of a memory block according to the circuit diagram of FIG. 3 according to an embodiment of the inventive concept.

Referring to FIG. 4, the memory block BLKb is formed in a vertical direction with respect to a substrate SUB. The substrate SUB has a first conductivity type (e.g., p type), and common source lines CSL that extend in a first direction (e.g., the X direction) and are doped with impurities of a second conductivity type (e.g., n type) may be provided in the substrate SUB. The common source line CSL may function as a source region supplying currents to vertical memory cells. A plurality of insulation films IL extending in a second direction (e.g., the Y direction) are sequentially provided in a third direction (e.g., the Z direction) on a region of the substrate SUB between two adjacent common source lines CSL, and the insulation films IL are a certain distance apart from one another in the third direction. For example, the insulation films IL may include an insulating material like silicon oxide.

Channel holes, which are sequentially arranged in the first direction and penetrate through the insulation films IL in the third direction, may be provided on the region of the substrate SUB between two adjacent common source lines CSL. A channel hole may be formed in a cup-like shape (or a cylindrical shape with a closed bottom) extending in a vertical direction. Alternatively, the channel hole may be formed in a pillar-like shape as shown in FIG. 4. Hereinafter, the channel holes will be referred to as pillars. A plurality of pillars P may contact the substrate SUB by penetrating through the insulation films IL. In detail, a surface layer S of each pillar P may include a silicon-based material doped with impurities of the first conductivity type and function as a channel region. On the other hand, an internal layer I of each pillar P may include an insulating material like silicon oxide or an air gap.

A charge storage layer CS is provided along exposed surfaces of the insulation films IL, the pillars P, and the substrate SUB in the region between the two adjacent common source lines CSL. For example, the charge storage layer CS may have an oxide-nitride-oxide (ONO) structure. Additionally, in a region between two adjacent common source lines CSL, a gate electrode GE may be provided on an exposed surface of the charge storage layer CS.

Drains or drain contacts DR are provided on the pillars P, respectively. For example, the drains or the drain contacts DR may include a silicon-based material doped with impurities of the second conductivity type. Bit lines BL extending in the second direction (e.g., the Y direction) and being a certain distance apart from one another in the first direction may be provided on the drains or drain contacts DR. An example of a memory block has been described with reference to FIG. 4. However, the inventive concept is not limited thereto, and various modifications may be made to the structure of the memory block.

Figure 5A:
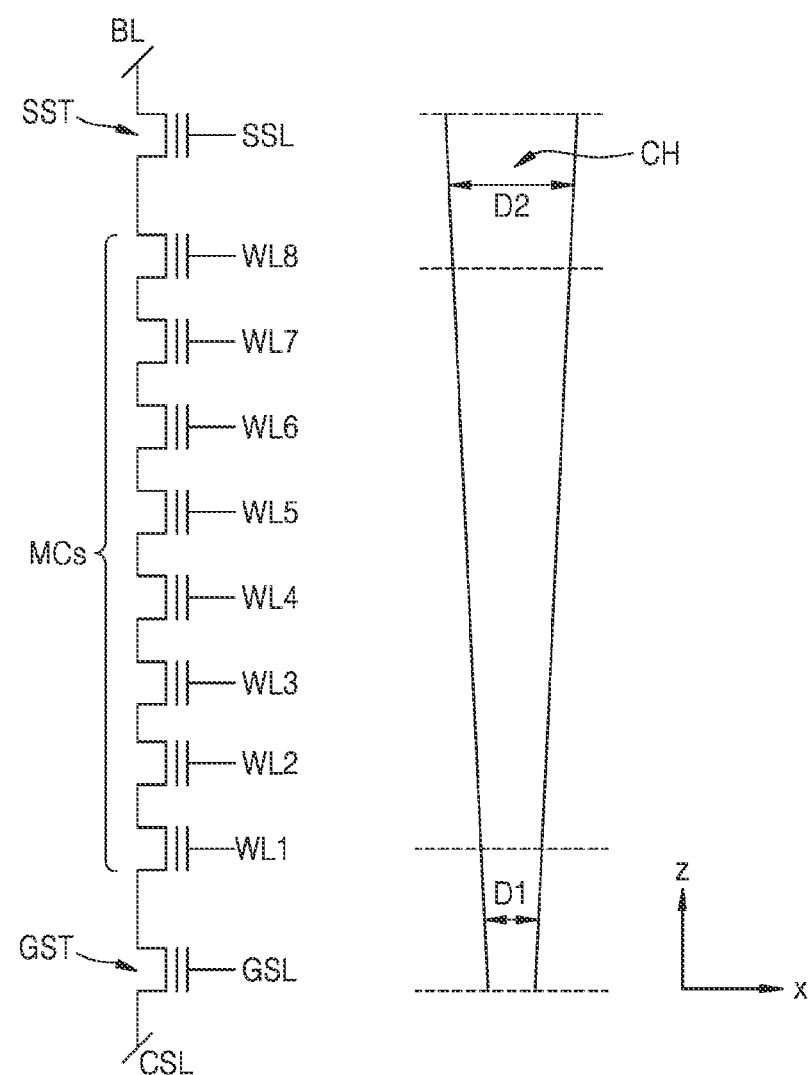
FIG. 5A is a diagram showing a channel hole of a cell string of a memory block according to an embodiment of the inventive concept.

FIG. 5A is a diagram showing a channel hole of a cell string of a memory block according to an embodiment of the inventive concept.

Referring to FIGS. 4 and 5A together, the pillars P may be formed in the channel hole CH formed by etching a mold formed by stacking select lines GSL and SSL and the word lines WL1 to WL8. The diameter of the channel hole CH may decrease in a direction toward the substrate SUB. Therefore, a size (or diameter) D2 of the channel hole CH near the string select transistor SST may be larger than a size D1 of the channel hole CH near the ground select transistor GST. This is because the channel hole CH is formed by etching from the top of the mold in a direction toward the substrate SUB.

Since the size D2 of the channel hole CH at a position corresponding to the string select transistor SST is larger than the size D1 of the channel hole CH at a position corresponding to the ground select transistor GST, a channel width of the string select transistor SST may be larger than that of the ground select transistor GST. In other words, the size of the string select transistor SST may be larger than the size of the ground select transistor GST. Accordingly, speed of an operation like a write operation, a read operation, or an erase operation for the memory cells MCs within the same memory block may become slower in the direction from the ground select transistor GST to the string select transistor SST. Therefore, when a program operation is performed on a memory block for the same time, a difference occurs between the threshold voltage distribution of memory cells located near the string select transistor SST and the threshold voltage distribution of memory cells located near the ground select transistor GST, and the difference may cause the width of the threshold voltage distribution of memory cells in program state to increase.

Figure 5B:
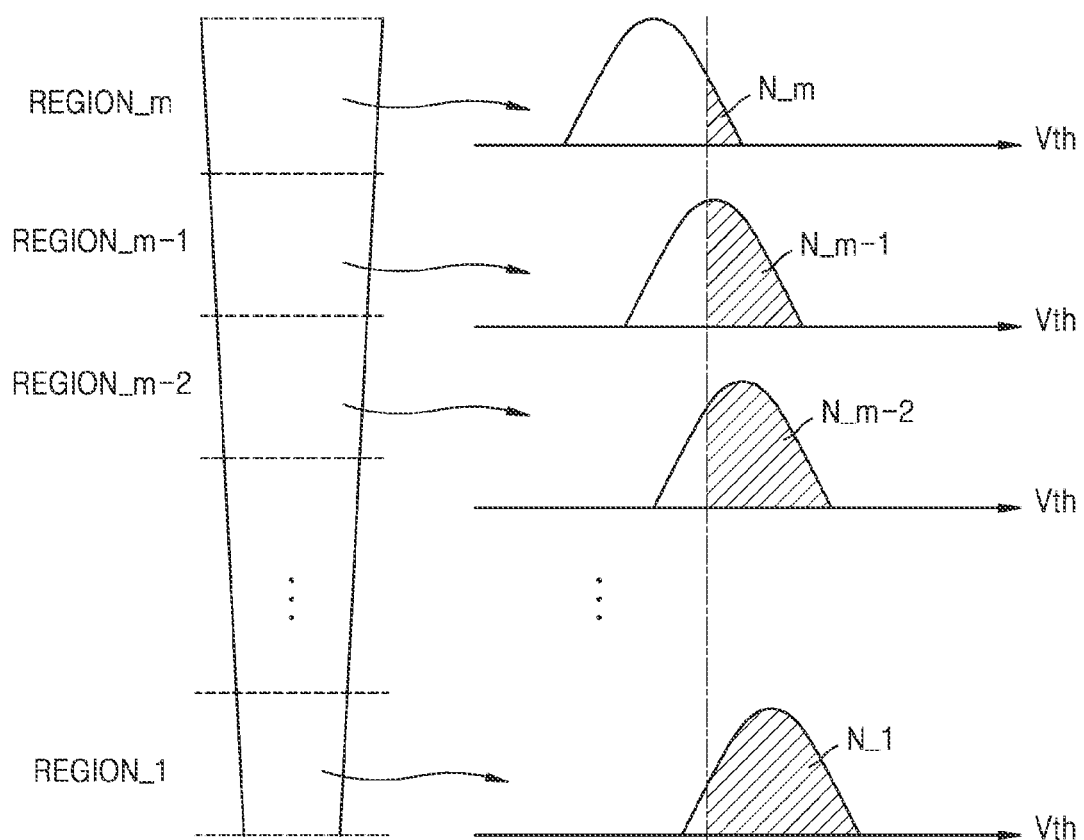
FIG. 5B is a diagram showing a threshold voltage distribution after a program operation for each memory region according to an embodiment of the inventive concept.

FIG. 5B is a diagram showing a threshold voltage distribution after a program operation for each memory region according to an embodiment of the inventive concept. Although FIG. 5B is described with respect to a memory block that has a 3-dimensional structure, it is merely an example for convenience of explanation, and the inventive concept is not limited thereto.

Referring to FIGS. 5B and 1 together, the control logic 120 may divide and manage memory blocks in the memory cell array 110 into m (where m is a natural number) memory regions REGION_1 to REGION_m. For example, when performing a program operation, the control logic 120 may control the levels of program pulses differently or the numbers of program loops differently for respective memory regions. As described above with reference to FIG. 5A, a size of a channel hole at a location corresponding to a memory cell connected to a word line close to a substrate may be smaller than a size of the channel hole at a location corresponding to a memory cell connected to a word line far from the substrate.

In other words, the size of a channel hole of a memory block may gradually increase in a direction from a first memory region REGION_1 to an m-th memory region REGION_m. Additionally, the speed of data operations for memory cells may become gradually slower in the direction from the first memory region REGION_1 to the m-th memory region REGION_m.

Due to locations of memory cells and the memory blocks and/or physical characteristics of the memory cells and the memory blocks, speeds at which memory cells are erased may be different from one another. For example, when a memory block has a 3-dimensional structure, the size of a channel hole increases as a distance between a word line and the substrate increases, and thus the speed at which memory cells are programmed may become slower. For example, the speed at which memory cells are programmed may become gradually slower in the direction from the first memory region REGION_1 to the m-th memory region REGION_m.

The threshold voltage distribution of the first memory region REGION_1 may be located to the right of the threshold voltage distribution of the m-th memory region REGION_m. In the case of the first memory region REGION_1, since the program speed is high, the threshold voltage distribution thereof may be mostly located to the right of a verify voltage $V_{vfy}$. Cells located to the right of the verify voltage $V_{vfy}$ are already programmed, and no current may flow therein when the verify voltage $V_{vfy}$ is applied. Memory cells that are already programmed and located to the right of the verify voltage $V_{vfy}$ may correspond to off cells. The threshold voltage distribution of the m-th memory region REGION_m may be mostly located to the left of the verify voltage $V_{vfy}$. In other words, since the program speed is slower as the distance from the substrate increases, most of the threshold voltage distribution of the m-th memory region REGION_m may not be programmed yet. Memory cells that have not yet been programmed may be turned on and current may flow therein when the verify voltage $V_{vfy}$ is applied. Memory cells that have not yet been programmed and are located to the left of the verify voltage $V_{vfy}$ may correspond to on cells. In other words, the number of off cells in a memory region exhibiting a slow program speed may be smaller than the number of off cells in a memory region exhibiting a high program speed.

Figure 5C:
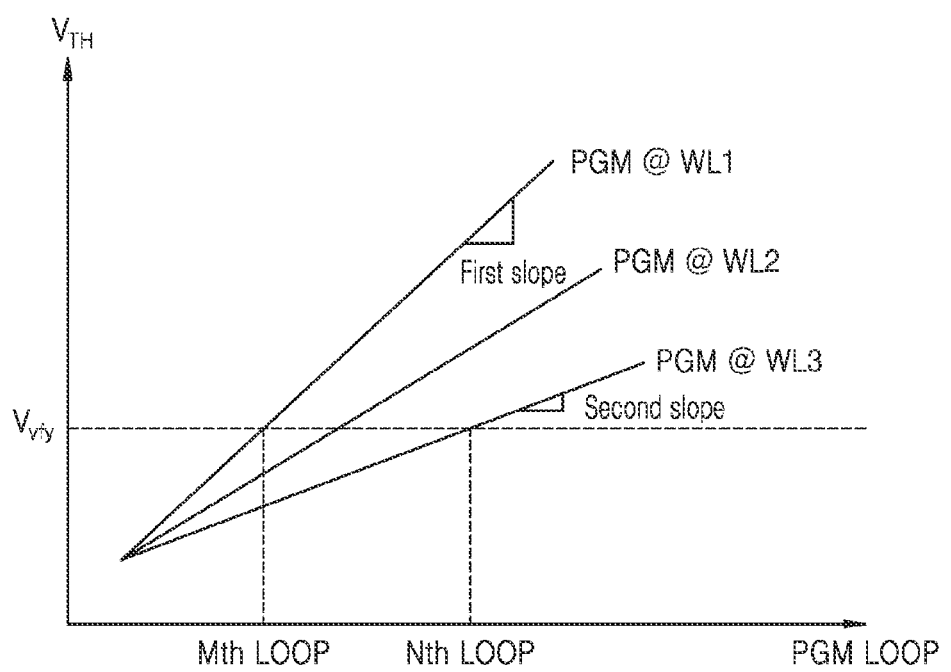
FIGS. 5C and 5D are graphs showing increment step pulse program (ISPP) efficiency according to embodiments of the inventive concept.
Figure 5D:
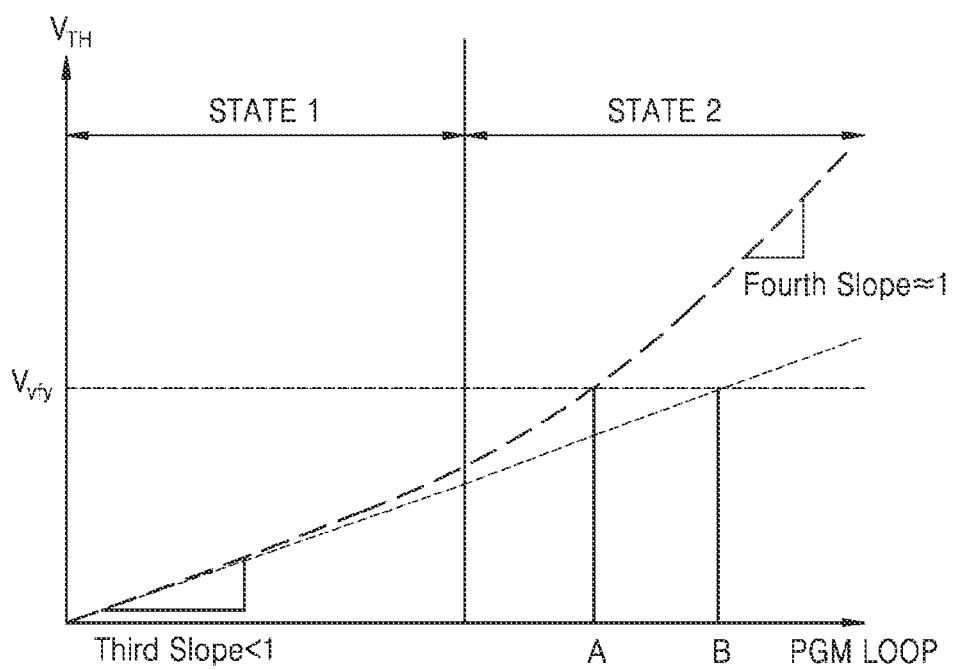

FIGS. 5C and 5D are graphs showing ISPP efficiency according to embodiments of the inventive concept.

Referring to FIGS. 5C and 5D, the horizontal axis represents the ISPP loop count, and the vertical axis represents the threshold voltage levels of selected memory cells.

According to embodiments of the inventive concept, a first word line WL1 may correspond to a word line close to the substrate, and a second word line WL2 and a third word line WL3 may correspond to word lines that are further away from the substrate.

Since the first word line WL1 is a word line close to the substrate, the size of a channel hole at a location corresponding to the first word line WL1 may be relatively small. Therefore, the programming speed of memory cells included in the first word line WL1 may be relatively high. As ISPP loops are repeatedly performed, the threshold voltage of memory cells included in the first word line WL1 may increase along a first slope. Since the third word line WL3 is a word line vertically further from the substrate, the size of the channel hole at a location corresponding to the third word line WL3 may be relatively large. Therefore, the programming speed of memory cells included in the third word line WL3 may be relatively low. As ISPP loops are repeatedly performed, the threshold voltage of memory cells included in the third word line WL3 may increase along a second slope. The second slope may be smaller than the first slope. In other words, since the memory cells included in the third word line WL3 exhibit a relatively slow programming speed, even when ISPP loops are repeated, the threshold voltage thereof may increase slowly.

In the case of the first word line WL1, the threshold voltage of the first word line WL1 may exceed the verify voltage $V_{vfy}$ when an M-th loop of the ISPP is completed. After the threshold voltage exceeds the verify voltage $V_{vfy}$, application of the verify voltage $V_{vfy}$ in the ISPP loop may not be skipped. This is because memory cells may be over-programmed while repeating the ISPP loops.

On the other hand, in the case of the third word line WL3, the threshold voltage of the third word line WL3 may exceed the verify voltage $V_{vfy}$ only after an N-th loop of the ISPP is completed. Here, N may be a natural number greater than M. The program speed becomes slower for a word line located farther from the substrate, and a time point at which the threshold voltage reaches the verify voltage $V_{vfy}$ and verification is not skipped may be slower than a word line close to the substrate. Therefore, the word line located farther from the substrate may have more sections in which verification may be skipped. Accordingly, the memory device 100 may reduce the total program time and improve program performance by securing as many sections as possible in which verification may be skipped for memory cells exhibiting a slow program speed.

According to embodiments of the inventive concept, referring to FIG. 5D, ISPP efficiency may be improved as the ISPP loop proceeds. The ISPP efficiency may be divided into a first state STATE 1 and a second state STATE 2. In the first state STATE 1, the ISPP efficiency may be less than 1.

According to embodiments of the inventive concept, the cross-section of a channel hole may have various shapes other than a circular shape. Referring to FIG. 5B, the channel hole of the m-th memory region REGION_m is etched to have a circular cross-section. However, for example, when the channel hole of the first memory region REGION_1 is etched to have an elliptical cross-section, trapped electrons form asymmetry due to the channel hole having the elliptical cross-section, and thus the ISPP efficiency may be significantly deteriorated. Therefore, when a verify voltage (e.g., $V_{vfy}$) is applied in a first loop of the ISPP and a program speed is predicted according to the number of off cells, it may be predicted that the threshold voltage will reach the verify voltage only after repeating the loop B times.

According to embodiments of the inventive concept, when entering the second state STATE 2, the ISPP efficiency may gradually recover and become close to 1. As program operations are repeatedly performed according to the ISPP, charge by trapped electrons reduces an electric field between a gate and a channel, and the ISPP efficiency may be gradually improved and may become close to 1. Therefore, even when loops are repeated only A times before repeating the loops B times while performing the actual ISPP, over-programming may already occur.

Figure 6:
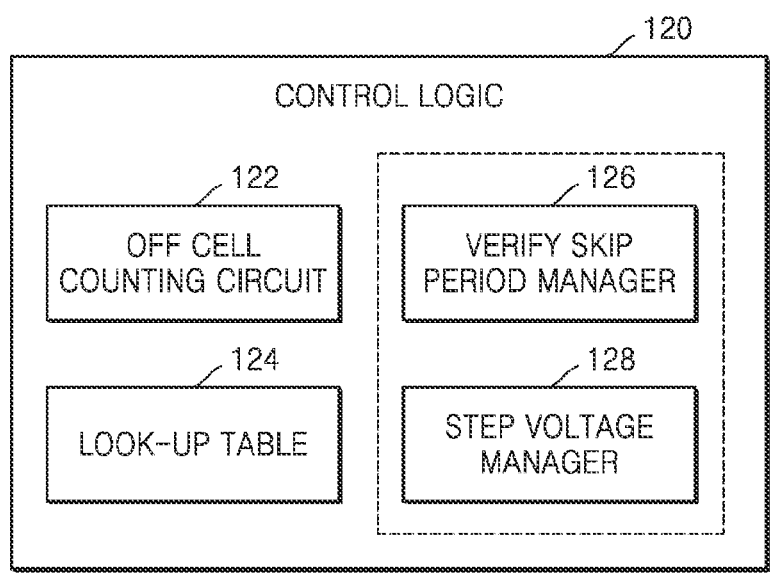
FIG. 6 is a block diagram showing a control logic according to an embodiment of the inventive concept.

FIG. 6 is a block diagram showing a control logic according to an embodiment of the inventive concept.

Referring to FIG. 6, the control logic 120 of FIG. 1 may include an off cell counting circuit 122, a look-up table 124, a verify skip period manager 126, and a step voltage manager 128. As described above, the control logic 120 may be a circuit according to embodiments of the inventive concept, and thus elements of the control logic 120 may also be circuits according to embodiments of the inventive concept.

The off cell counting circuit 122 may receive a sensing value from the page buffer 150 and count the number of off cells based thereon. The off cell counting circuit 122 may include a plurality of latches for temporarily storing sensing values received from the page buffer 150. For example, a plurality of verify voltage pulses may be applied to word lines for each ISPP loop. The page buffer 150 may output values of sensing bit lines to the off cell counting circuit 122 whenever the verify voltage pulses are applied. The off cell counting circuit 122 may store the values of the sensing bit lines through each of the plurality of latches every time the plurality of verify voltage pulses are applied. When all the verify voltage pulses are applied, the off cell counting circuit 122 may calculate the number of memory cells exceeding a target threshold voltage by using the sensing values stored in the latches. The off cell counting circuit 122 may output a calculated off cell count value to the verify skip period manager 126 and the step voltage manager 128.

The verify skip period manager 126 may determine a period in which a verify pulse is not applied. The verify skip period manager 126 may determine a first verify skip period by referring to an off cell count value received from the off cell counting circuit 122 and the look-up table 124. The first verify skip period may refer to a period in which a verify pulse is not applied every loop from the first loop of the ISPP.

For example, when the off cell count value is included in a pre-defined period, the verify skip period manager 126 may determine the first loop to the eighth loop as a first verify skip period.

In another example, the verify skip period manager 126 may increase the length of the first verify skip period when the off cell count value is less than the minimum value of the pre-defined period. For example, the first verify skip period may correspond to the first to tenth loops. When the off cell count value is less than the minimum value of the pre-defined period, it may be determined that the program speed of memory cells is very slow. Accordingly, the verify skip period manager 126 may extend the period, in which the verify pulse is not applied, to the tenth loop.

In another example, the verify skip period manager 126 may reduce the length of the first verify skip period when the off cell count value is greater than the maximum value of the pre-defined period. For example, the first verify skip period may correspond to the first to fifth loops. The off cell count value may be greater than the maximum value of the pre-defined period, because, due to high program speed of memory cells, there are many cells having threshold voltages that reached the verify voltage. Therefore, the verify skip period manager 126 may shorten the period, in which the verify pulse is not applied, to the fifth loop.

Although the above-described embodiment has been described where the length of the first verify skip period is variably determined based on the off cell count value, the inventive concept is not limited thereto. According to embodiments of the inventive concept, the verify skip period manager 126 may determine the length of the first verify skip period according to a result of comparing an off cell count value with a pre-defined reference value. For example, when the off cell count value is less than a pre-defined reference value, the verify skip period manager 126 may determine the length of the first verify skip period as 8 loops. In this case, a plurality of verify pulses may not be applied in each loop from the second to eighth loops. In another example, the verify skip period manager 126 may determine the length of the first verify skip period as 5 loops when the off cell count value is greater than the pre-defined reference value, e.g., when the program speed of the memory cell is high. In this case, a plurality of verify pulses may not be applied in each loop from the second to fourth loops.

According to embodiments of the inventive concept, the verify skip period manager 126 may determine a second verify skip period after the first verify skip period. For example, when the first verify skip period is the first to eighth loops, after a program pulse of the ninth loop is applied, a plurality of verify voltage pulses may be applied through the word lines. In this case, the number of the verify voltage pulses may be 9. The off cell counting circuit 122 may store values obtained by sensing bit lines through each of a plurality of latches every time the verify voltage pulses are applied, and transmit an off cell count value to the verify skip period manager 126. Hereinafter, an off cell count value for determining the second verify skip period will be referred to as a second off cell count value.

The verify skip period manager 126 may compare the second off cell count value with a pre-defined critical value and determine the second verify skip period according to a result of the comparison. The verify skip period manager 126 may determine that the program speed of memory cells is still slow when the second off cell count value is less than the pre-defined critical value. Therefore, the verify skip period manager 126 may determine a period in which the verify pulse is not additionally applied based on a result of the comparison. The length of the second verify skip period may be determined in advance. For example, the length of the second verify skip period may be 3 loops. In this case, a plurality of verify pulses may not be applied in each loop from the tenth to twelfth loops. The verify skip period manager 126 may change the length of the second verify skip period by loading and using the number of program/erase cycles, temperature information, program order information, etc. stored in the look-up table 124. For example, when the number of program/erase cycles is too large, the length of the second verify skip period may be reduced to 1 loop. The look-up table 124 may also store a mapping result according to an off cell count value (e.g., the second off cell count value).

The look-up table 124 may store various pieces of information to be output to the verify skip period manager 126 and the step voltage manager 128 in advance. For example, the look-up table 124 may include at least information regarding an order of program loops, temperature information when executing the program loops, or program/erase (PE) cycle information for a block to which a target word line of the program loops belongs. According to an embodiment of the inventive concept, the look-up table 124 may map and store (e.g., as the mapping result) information regarding cell speed detection output from the off cell counting circuit 122, information regarding a period to skip verification according to the count of P/E cycles for a block to which a target word line belongs, and/or information regarding a changed value of a step voltage in advance.

Figure 7:
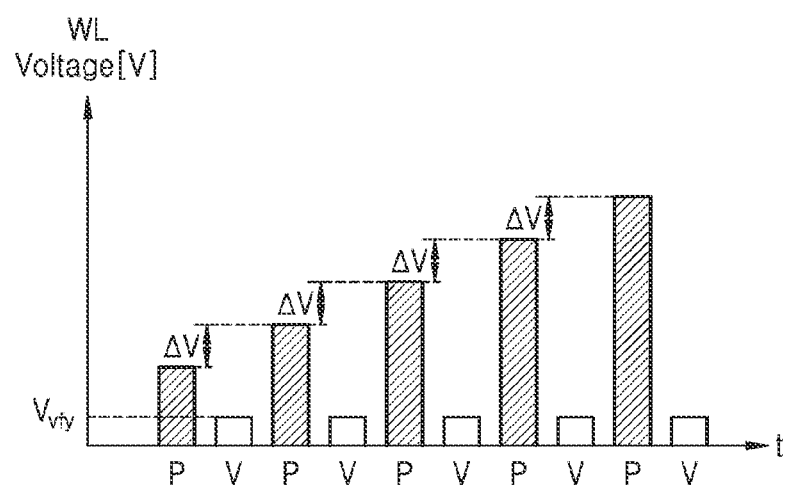
FIG. 7 is a diagram showing program pulses and verify pulses applied over time when an ISPP program is executed according to an embodiment of the inventive concept.

FIG. 7 is a diagram showing program pulses and verify pulses applied over time when an ISPP program is executed according to an embodiment of the inventive concept.

Referring to FIG. 7, the horizontal axis represents time and the vertical axis represents program pulses P and verify pulses V applied to a word line of a memory cell.

According to embodiments of the inventive concept, an ISPP cycle may be increased as much as a step voltage $\Delta V$ for each program pulse. A program pulse time may be fixed to a pre-set time. A verify pulse V for verifying whether a program is pass may be applied between the program pulses P. The number of the verify pulses V may be determined based on how many bits a memory cell may store. For example, when a memory cell is a QLC, there may be 15 verify pulses. In other words, when 15 program pulses P are applied to perform a program operation on one page, 15 verification operations may be performed. A memory cell to which the program operation is successfully performed may be changed to a program inhibit state and may not be over-programmed. A program operation may be performed on a memory cell, to which a program operation has failed, by using the program pulses P that increase according to the step voltage $\Delta V$ until the memory cell is successfully programmed.

Figure 8A:
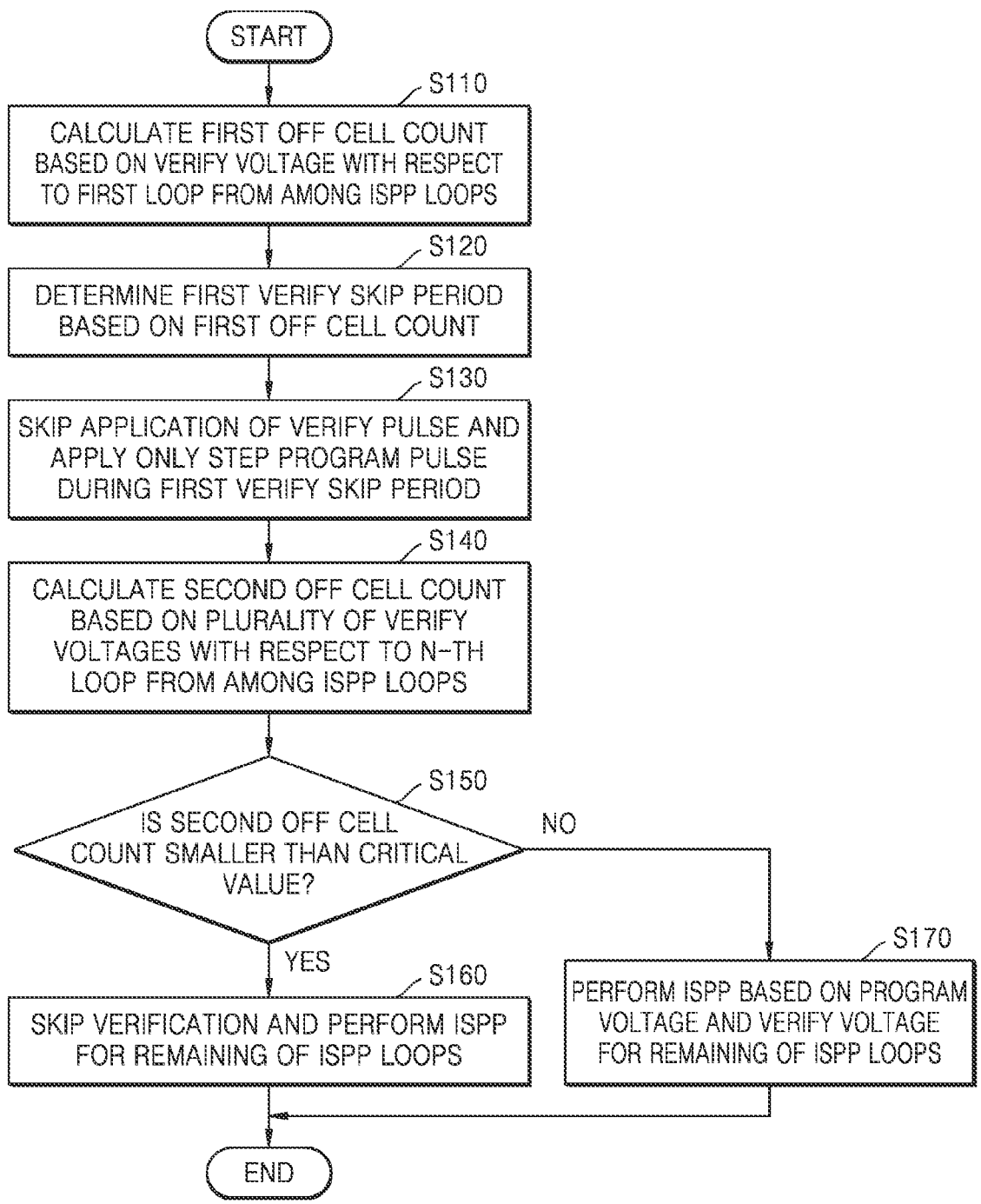
FIG. 8A is a flowchart of a method of operating a memory device according to an embodiment of the inventive concept.

FIG. 8A is a flowchart of a method of operating a memory device according to an embodiment of the inventive concept.

Referring to FIG. 8A, in operation S110, the memory device 100 may calculate an off cell count based on a first verify voltage for a first loop of ISPP loops. The first verify voltage may correspond to a voltage level for distinguishing between an erase state E and a first program state P1. When a first program voltage is applied, the threshold voltage of at least some of memory cells may exceed the first verify voltage according to the program speed of the memory cells.

The memory device 100 may count the first off cell count by applying the first verify voltage.

In operation S120, the memory device 100 may determine a first verify skip period based on a first off cell count value. According to an embodiment of the inventive concept, the first off cell count value may be inverse proportional to the length of the first verify skip period. For example, when the first off cell count value is less than the minimum value of a pre-defined period, the first verify skip period may correspond to first to tenth loops. When the first off cell count value is greater than the maximum value of the pre-defined period, the first verify skip period may correspond to first to fifth loops. In another example, when the first off cell count value is included in the pre-defined period, the first verify skip period may correspond to first to n-th loops. The n-th loop is a pre-defined loop value, and may be, for example, an eighth loop.

In operation S130, the memory device 100 may determine to skip verification up to the n-th loop from among the ISPP loops and perform the ISPP. Since it is predictable that memory cells will not be over-programmed even without determining over-program by applying a verify voltage in each loop up to the n-th loop, the memory device 100 may bypass application of a plurality of verify pulses in each loop from first to n-th loops, which is the first verify skip period, and apply a plurality of program pulses that increase as much as a step voltage.

In operation S140, the memory device 100 may calculate an off cell count based on an (n+1)-th verify voltage for an (n+1)-th loop. Since the first verify skip period determined in operation S120 ended, the memory device 100 may apply a program pulse and a plurality of verify pulses with respect to the (n+1)-th loop and count the number of off cells based on an output signal of the page buffer 150. The off cell count counted for the (n+1)-th loop will be referred to as a second off cell count value.

In operation S150, the memory device 100 may compare a critical value with the second off cell count value. The memory device 100 may determine whether to perform an additional verification skip based on a result of the comparison of the critical value with the second off cell count value.

If the second off cell count value is smaller than the critical value, in operation S160, the memory device 100 may skip verification and perform the ISPP for the remaining loops from among the ISPP loops. The verification skip for the remaining loops may be referred to as an additional verification skip. In operation S150, since the second off cell count value is smaller than the critical value, the memory device 100 may determine that the program speed of memory cells currently being programmed is still slow. In consideration of the program speed, the memory device 100 may determine that the memory cells will not be over-programmed even without applying a verify voltage in each of the remaining loops of the ISPP program. The memory device 100 may apply program pulses that increase as much as a step voltage every time the remaining loops are repeated, and may not apply a plurality of verify pulses.

On the other hand, if the second off cell count value is greater than or equal to the critical value, in operation S170, the memory device 100 may execute an ISPP program based on a program voltage and a verify voltage for the remaining loops. When it is determined that the second off cell count value is greater than the critical value, it may be determined that the memory cells currently being programmed exhibit a high programming speed. In other words, when it is not determined whether a program is completed using verify pulses in a next loop even though an ISPP efficiency is changed, over-program may occur. Therefore, the memory device 100 may perform the ISPP by applying a program pulse and a verify pulse in each of the remaining loops from among the ISPP loops.

FIG. 8B is a graph illustrating the method of FIG. 8A according to an embodiment of the inventive concept.

Referring to FIGS. 8A and 8B together, the memory device 100 may apply a start program pulse $PGM_1$ and a verify pulse $P_1$ in a first loop LOOP 1. The memory device 100 may identify the number of memory cells having threshold voltages exceeding the verify pulse $P_1$ through the off cell counting circuit 122. The memory device 100 may determine a first verify skip period FIRST VRFY SKIP based on an off cell count value. The first verify skip period FIRST VRFY SKIP may correspond to a second to (N−1)-th loop LOOP 2 to LOOP N−1.

The memory device 100 may trigger the off cell counting circuit 122 in response to the end of the first verify skip period FIRST VRFY SKIP. It may be assumed that, at the time of an N-th loop LOOP N, memory cells are programmed to a K-th program state. Therefore, an N-th program pulse $PGM_N$ and a plurality of verify pulses $P_N$ to $P_K$ may be applied in the N-th loop LOOP N. The off cell counting circuit 122 may identify the number of off cells according to a sensing result of the verify pulses $P_N$ to $P_K$. When the off cell count value is less than a critical value, the memory device 100 may skip application of remaining verify pulses $P_{15}$ to $P_{N+1}$ with respect to remaining loops LOOP N+1 to LOOP J in a second verify skip period SECOND VRFY SKIP.

Figure 9:
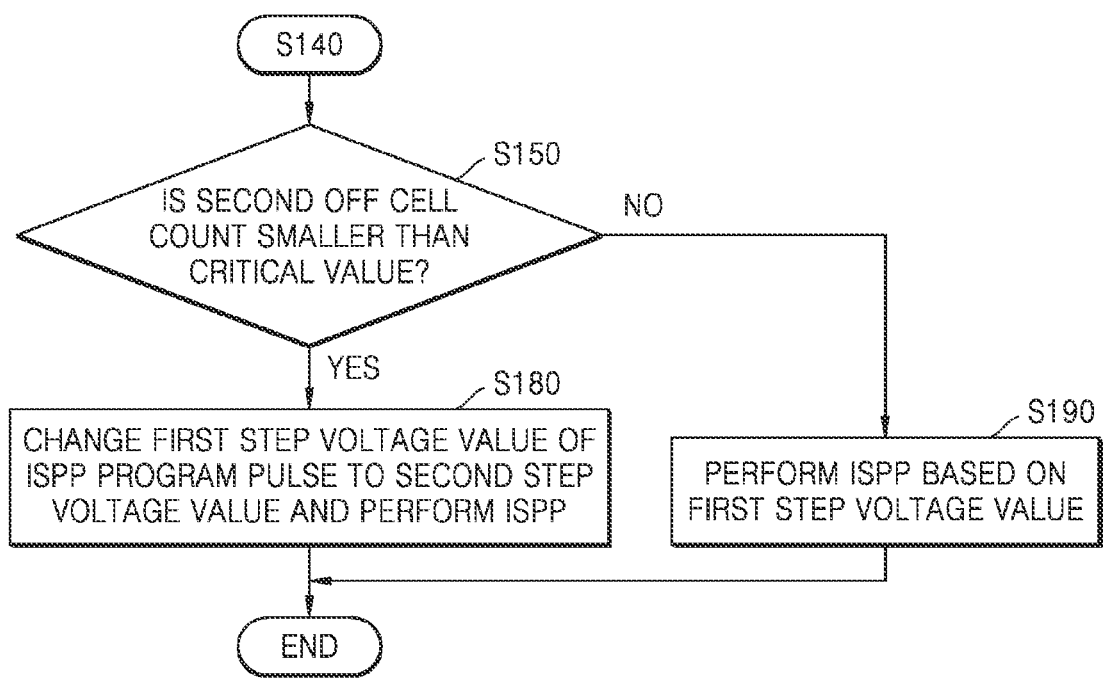
FIG. 9 is a flowchart of a method of operating a memory device according to an embodiment of the inventive concept.

FIG. 9 is a flowchart of a method of operating a memory device according to an embodiment of the inventive concept. Descriptions identical to those already given above with reference to FIG. 8A will be omitted.

If the second off cell count value is smaller than the critical value, in operation S180, the memory device 100 may change a first step voltage value of an ISPP program pulse to a second step voltage value. The second step voltage value may be greater than the first step voltage value. Therefore, a program voltage applied to a memory cell may be increased more rapidly every time each loop is performed in the ISPP. As the size of a program pulse applied to a target word line is rapidly increased in each loop, the threshold voltage of a memory cell may reach a verify voltage by repeating a smaller number of loops, and thus the total number of loops repeated in the ISPP may be reduced. As a result, program performance may be improved.

On the other hand, if the second off cell count value is greater than or equal to the critical value, in operation S190, the memory device 100 may perform the ISPP based on the first step voltage value. When the memory device 100 performs the ISPP according to an increased second step voltage value, an over program may occur. Therefore, the memory device 100 may perform the ISPP by using a program voltage that slowly increases in each loop based on an unchanged first step voltage value.

Referring to FIGS. 8B and 9 together, the memory device 100 may obtain an off cell count value based on a plurality of verify pulses $P_N$ to $P_K$ applied in the N-th loop. Thereafter, when the off cell count value is less than the critical value, the memory device 100 may determine to increase the step voltage for the remaining loops ((N+1)-th loop to J-th loop). In this case, a difference between the voltage levels of a program pulse $PGM_{N+1}$ applied in the (N+1)-th loop and a program pulse $PGM_N$ applied in the N-th loop may be greater than a difference between the voltage levels of the program pulse PGM$_N$ applied in the N-th loop and a program pulse PGM$_{N-1}$ applied in the (N−1)-th loop.

Figure 10A:
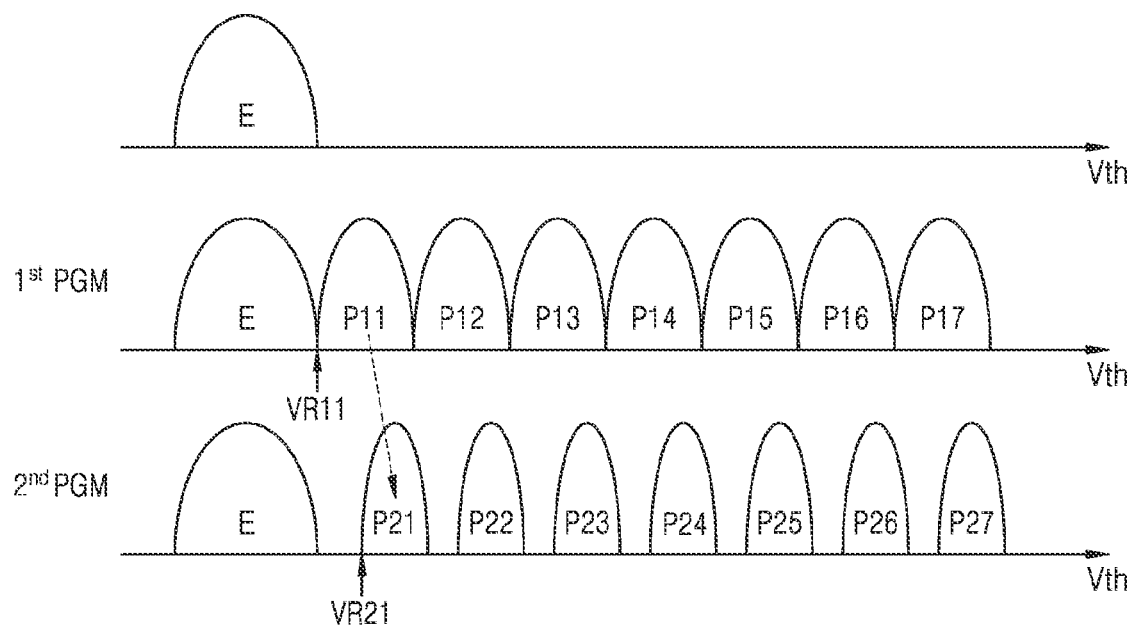
FIG. 10A is a diagram showing distribution changes when reprogramming is performed according to an embodiment of the inventive concept.

FIG. 10A is a diagram showing distribution changes when reprogramming is performed according to an embodiment of the inventive concept.

Referring to FIG. 10A, a first program stage may be performed, such that each memory cell has a state corresponding to program data from among eight program states E, P11, P12, P13, P14, P15, P16, and P17. The memory cell may correspond to a TLC storing 3-bit data.

In the first program stage (1$^{st}$ PGM), a program operation may be performed, such that memory cells have a rough distribution corresponding to the program data. According to an embodiment of the inventive concept, in the first program stage, memory cells of a target word line may be roughly divided into eight program states according to the ISPP.

A second program stage (2$^{nd}$ PGM) may be for finely reprogramming program states formed through the first program stage. For example, a first program state P11 of the first program stage may be reprogrammed to a first program state P21 of the second program stage. Through the second program stage, the threshold voltage distribution of each of the program states may be re-shaped to be narrower. In other words, a verify voltage VR21 of ISPP loops in the second program stage may be greater than a verify voltage VR11 of corresponding ISPP loops in the first program stage.

Figure 10B:
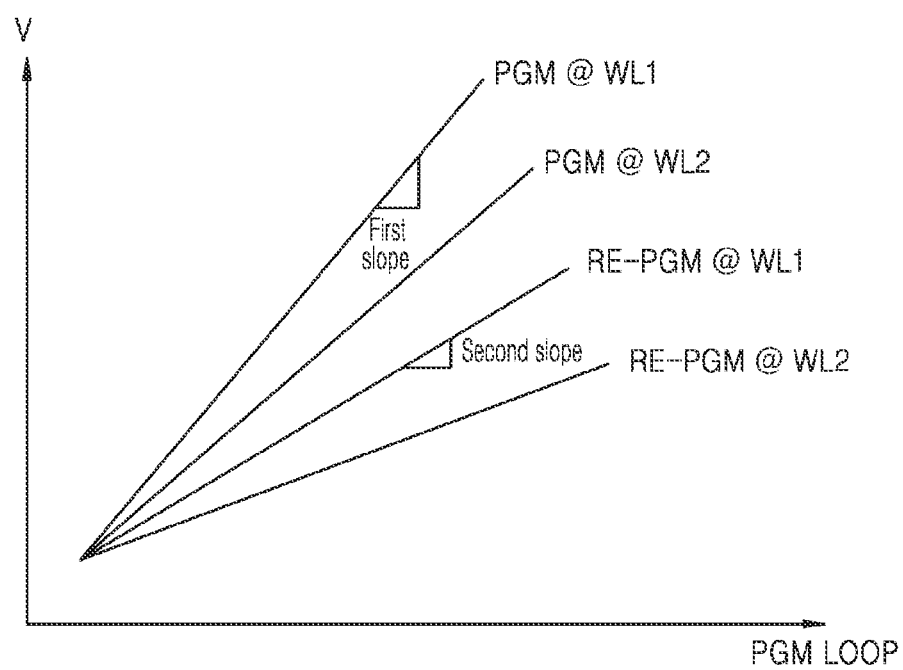
FIG. 10B is a diagram showing a graph between a program loop and a threshold voltage during reprogramming according to an embodiment of the inventive concept.
Figure 10C:
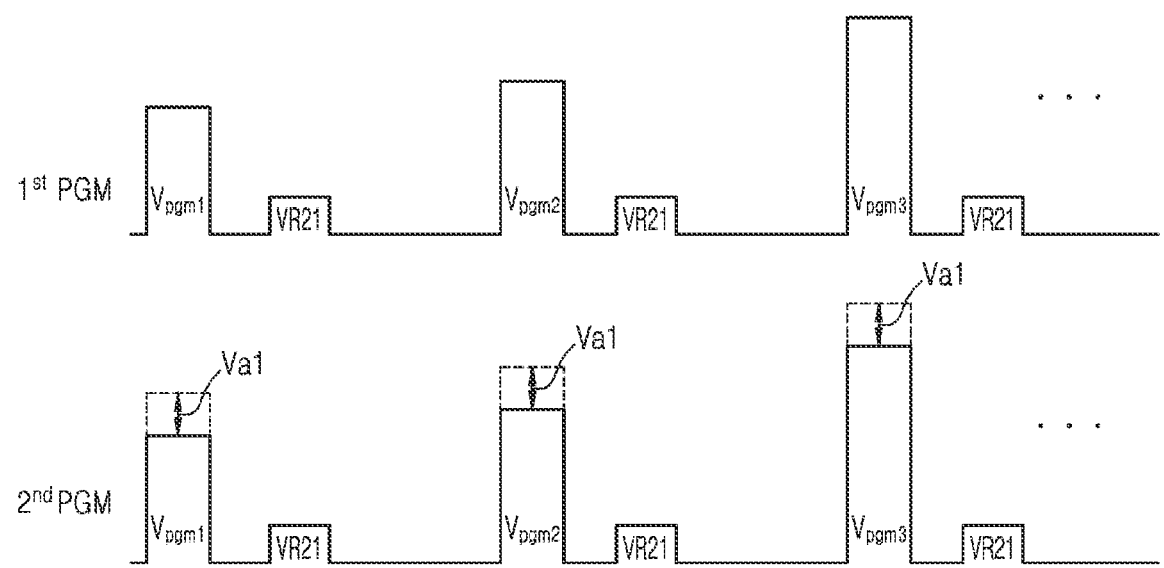
FIG. 10C is a diagram showing program start voltages according to an embodiment of the inventive concept.

FIG. 10B is a diagram showing a graph between a program loop and a threshold voltage during reprogramming according to an embodiment of the inventive concept. FIG. 10C is a diagram showing program start voltages according to an embodiment of the inventive concept.

Referring to FIG. 10B, when reprogramming is performed on the same memory cell, the reprogramming may be performed according to an ISPP with low efficiency. Referring also to FIG. 10A, the threshold voltage of a first word line WL1 may increase according to a first slope as the ISPP program is executed in the first program stage, and, in the second program stage, the threshold voltage of the first word line WL1 may increase according to a second slope to narrow the threshold voltage distribution for the same memory cell. The second slope may be smaller than the first slope.

Referring to FIG. 10C, when performing an ISPP of reprogramming, the memory device 100 may increase the program start voltage Vpgm1 as much as a voltage offset Va1. The memory device 100 may receive or load an off cell count obtained in the first program stage from the off cell counting circuit 122 prior to performing the second program stage. The memory device 100 may determine the magnitude of the voltage offset Va1 based on the off cell count. For example, the size of the voltage offset Va1 may be inverse proportional to an off cell count value. For example, when the off cell count value is greater than the maximum value of a pre-defined period, the magnitude of the voltage offset Va1 may be reduced. Since the program speed of a memory cell to be reprogrammed is not slow, when the magnitude of the voltage offset Va1 is increased, the memory cell may be over-programmed and overlap with the threshold voltage distribution of neighboring memory cells in program state. For example, when the off cell count value is smaller than the minimum value of a pre-defined period, the magnitude of the voltage offset Va1 may be increased. Since the program speed of a memory cell to be reprogrammed is slow, the voltage level of the start program pulse of the ISPP for reprogramming may be increased by increasing the magnitude of the voltage offset Va1. Therefore, in the reprogramming of the same memory cell, the number of repetition of loops of the ISPP and the time elapsed for reprogramming may be reduced.

Figure 11:
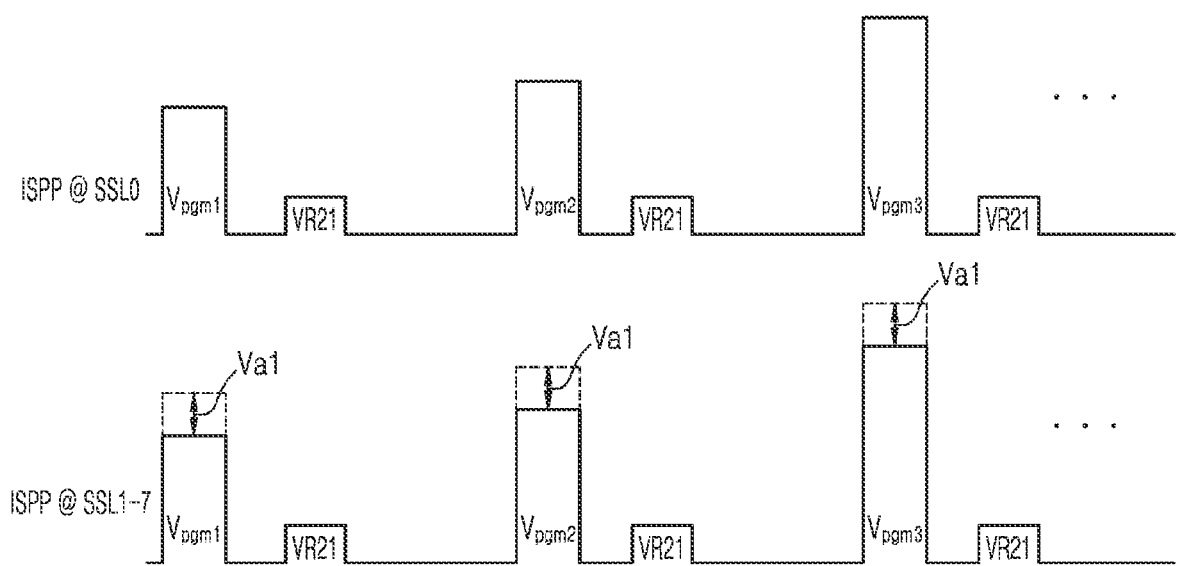
FIG. 11 is a diagram showing an example of correcting program start voltages of other string select lines according to an embodiment of the inventive concept.

FIG. 11 is a diagram showing an example of correcting program start voltages of other string select lines according to an embodiment of the inventive concept.

According to embodiments of the inventive concept, the memory device 100 may execute a program operation according to the direction of a word line. For example, referring to FIGS. 3 and 11 together, the first string select line SSL1 may be selected from the bit line BL1, and address scheduling may be sequentially performed from the lowermost word line WL1 to the uppermost word line WL8. In other words, when performing a program operation, the memory device 100 programs all pages of the first word line WL1 and then programs all pages of an adjacent second line WL2. In this regard, all pages may be sequentially programmed up to the uppermost word line WL8. When the program of the first string select line SSL1 is completed, the program of an adjacent second string select line SLL2 may be performed in substantially the same manner.

According to embodiments of the inventive concept, the memory device 100 may utilize off cell count information obtained through an ISPP program of the first string select line SSL1 for programming the second string select line SSL2. For example, the control logic 120 may further include a buffer memory for storing off cell information. When executing the ISPP program from the first word line WL1 to the uppermost word line WL8 in the first string select line SSL1, the buffer memory may temporarily store off cell values obtained by measuring cell speeds according to different sizes of a channel hole for each word line. For example, when executing an ISPP program from the first word line WL1 to the uppermost word line WL8 in the first string select line SSL1, when a verify voltage is applied in a first loop, the buffer memory may store the number of off cells as first to eighth off cell count values. Alternatively, the buffer memory may store information indicating a length of a verify skip period or information indicating a step voltage value, instead of an offset value for each word line.

According to embodiments of the inventive concept, the control logic 120 may correct a program start voltage when performing an ISPP for word lines from the first word line WL1 to the uppermost word line WL8 in the second string select line SSL2. For example, when the control logic 120 programs memory cells corresponding to the first word line WL1 of the second string select line SSL2, the control logic 120 may utilize characteristics of memory cells of the first word line WL1 of the first string select line SSL1. This is because characteristics like the size of a channel hole are similar between neighboring string select lines. When the control logic 120 performs an ISPP of memory cells corresponding to the second word line WL2 of the second string select line SSL2, a program voltage for a first loop may be increased based on a first off cell count value.

Referring to FIG. 11, when an ISPP of memory cells corresponding to the second word line WL2 of the second string select line SSL2 is performed, the voltage level of the start program pulse for a first loop may be increased as much as the voltage offset Va1. Alternatively, when performing the ISPP of the memory cells, the control logic 120 may set the same verify skip period based on the first off cell value. In other words, the control logic 120 may maximize the number of verification skips by programming memory cells included in the second string select line SSL2 by using off cell values of the memory cells included in the first string select line SSL1 or reduce the number of loops of the ISPP, thereby improving program efficiency.

Figure 12:
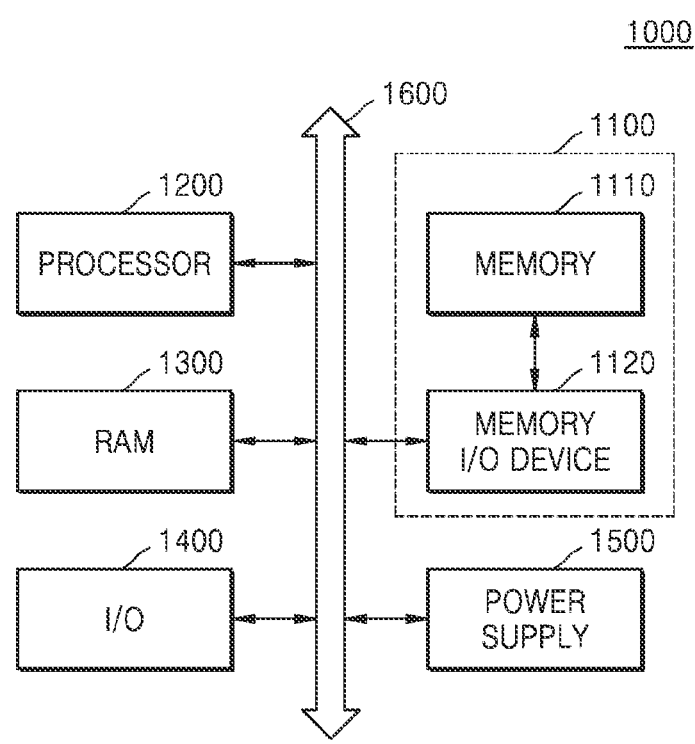
FIG. 12 is a block diagram showing a computing system including a non-volatile memory device according to an embodiment of the inventive concept.

FIG. 12 is a block diagram showing a computing system including a non-volatile memory device according to an embodiment of the inventive concept.

Referring to FIG. 12, a computing system 1000 may include a memory system 1100, a processor 1200, a RAM 1300, an input/output device 1400, and a power supply device 1500. The computing system 1000 may further include ports capable of communicating with a video card, a sound card, a memory card, a universal serial bus (USB) device, or other electronic devices. The computing system 1000 may be implemented as a personal computer or may be implemented as a portable electronic device like a laptop computer, a mobile phone, a personal digital assistant (PDA), or a camera.

The processor 1200 may perform particular calculations or tasks. According to embodiments of the inventive concept, the processor 1200 may be a micro-processor or a central processing unit (CPU). The processor 1200 may communicate with the RAM 1300, the input/output device 1400, and the memory system 1100 through a bus 1600 like an address bus, a control bus, or a data bus. The processor 1200 may also be connected to an expansion bus like a peripheral component interconnect (PCI) bus.

The memory system 1100 may include a non-volatile memory device 1110 implemented according to the embodiments of the inventive concept shown in FIGS. 1 to 11. According to embodiments of the inventive concept, an operation speed of programming the non-volatile memory device 1110 to a particular program state may be improved. The memory system 1100 may also include a memory I/O device 1120.

The input/output device 1400 may include an input unit like a keyboard, a keypad, or a mouse, and an output unit like a printer or a display. The power supply device 1500 may supply an operating voltage for the operation of the computing system 1000.

Figure 13:
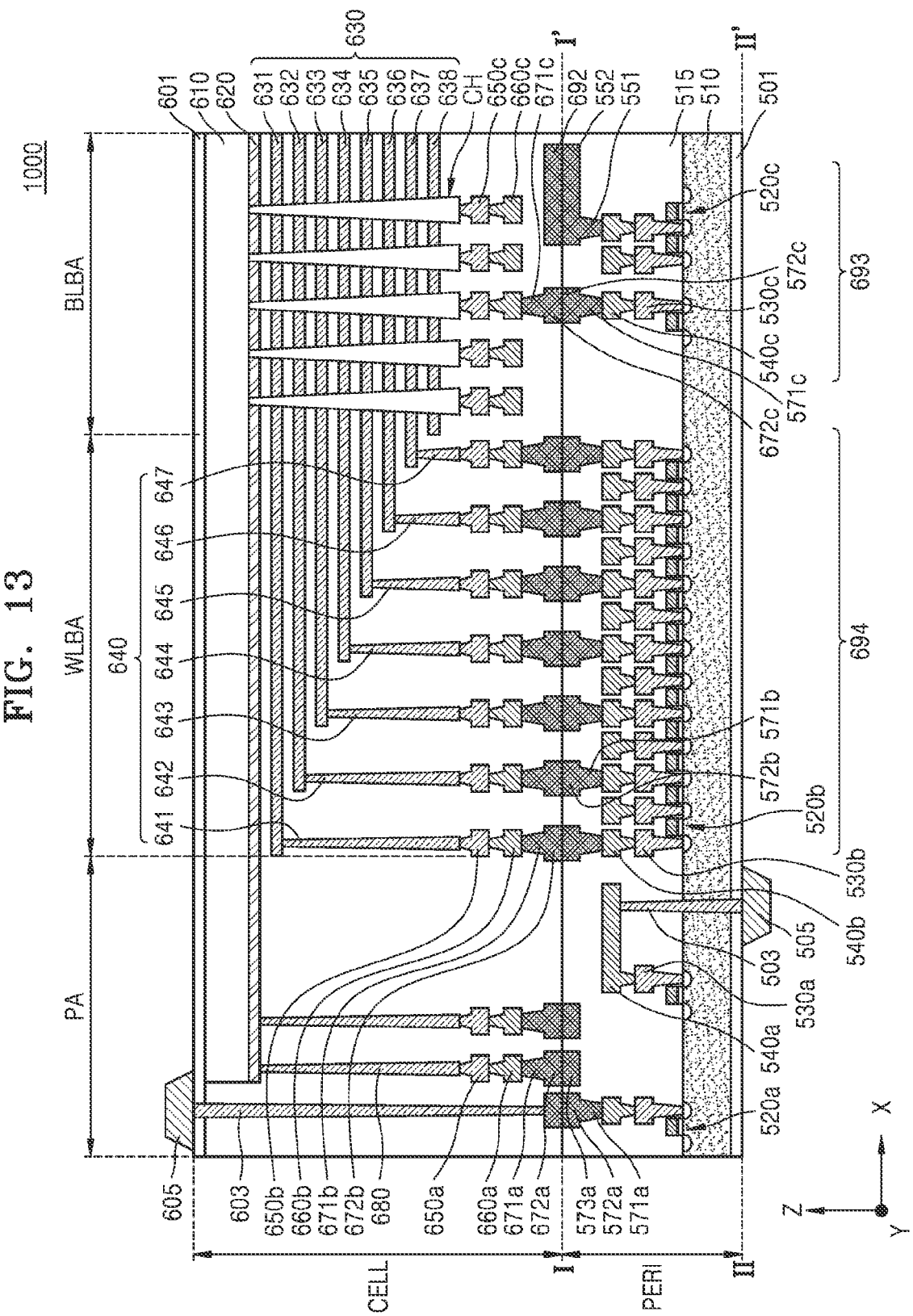
FIG. 13 is a diagram for describing a chip to chip (C2C) structure applied to a memory device according to an embodiment of the inventive concept.

FIG. 13 is a diagram for describing a chip to chip (C2C) structure applied to a memory device according to an embodiment of the inventive concept. The memory device 1000 is an implementation example of the memory device 100 of FIG. 1.

Referring to FIG. 13, the memory device 1000 may have a C2C structure. The C2C structure may refer to a structure formed by fabricating an upper chip including a cell region CELL on a first wafer, fabricating a lower chip including a peripheral circuit region PERI on a second wafer different from the first wafer, and connecting the upper chip and the lower chip to each other through bonding. For example, the bonding may refer to an electric connection between a bonding metal formed on a lowermost metal layer of the upper chip and a bonding metal formed on an uppermost metal layer of the lower chip. For example, when the bonding metal includes copper (Cu), the bonding may be a Cu—Cu bonding, and the bonding metal may also include aluminum or tungsten.

The peripheral circuit region PERI and the cell region CELL of the memory device 1000 may each include an external pad bonding area PA, a word line bonding area WLBA, and a bit line bonding area BLBA.

The peripheral circuit region PERI may include a first substrate 510, an interlayer insulation layer 515, a plurality of circuit elements 520a, 520b, and 520c formed on the first substrate 510, first metal layers 530a, 530b, and 530c respectively connected to the circuit elements 520a, 520b, and 520c, and second metal layers 540a, 540b, and 540c respectively formed on the first metal layers 530a, 530b, and 530c. In an embodiment of the inventive concept, the first metal layers 530a, 530b, and 530c may include tungsten having relatively high resistance, whereas the second metal layers 540a, 540b, 540c may include copper having relatively low resistance.

Although only the first metal layers 530a, 530b, and 530c and the second metal layers 540a, 540b, and 540c are shown and described in the present specification, the inventive concept is not limited thereto, and one or more metal layers may be further formed on the second metal layers 540a, 540b, and 540c. At least some of the one or more metal layers formed on the second metal layers 540a, 540b, and 540c may include a material like aluminum having a lower resistance than copper constituting the second metal layers 540a, 540b, and 540c.

The interlayer insulation layer 515 is provided on the first substrate 510 to cover the circuit elements 520a, 520b, and 520c, the first metal layers 530a, 530b, and 530c, and the second metal layers 540a, 540b, and 540c and may include an insulation material like a silicon oxide or a silicon nitride.

Lower bonding metals 571b and 572b may be formed on the second metal layer 540b in the word line bonding area WLBA. In the word line bonding area WLBA, the lower bonding metals 571b and 572b in the peripheral circuit region PERI may be electrically connected to upper bonding metals 671b and 672b in the cell region CELL through bonding, where the lower bonding metals 571b and 572b and the upper bonding metals 671b and 672b may include aluminum, copper, or tungsten.

The cell region CELL may provide at least one memory block. The cell region CELL may include a second substrate 610 and a common source line 620. On the second substrate 610, a plurality of word lines 631 to 638 (collectively, 630) may be stacked in a direction perpendicular to the top surface of the second substrate 610 (Z-axis direction). String select lines and a ground select line may be arranged on the top and bottom of the word lines 630, and the word lines 630 may be arranged between the string select lines and the ground select line.

In the bit line bonding area BLBA, a channel structure CH may extend in a direction perpendicular to the top surface of the second substrate 610 and penetrate through the word lines 630, the string select lines, and the ground select line. The channel structure CH may include a data storage layer, a channel layer, and a buried insulation layer, and the channel layer may be electrically connected to a first metal layer 650c and a second metal layer 660c. For example, the first metal layer 650c may be a bit line contact, and the second metal layer 660c may be a bit line. In an embodiment of the inventive concept, the bit line 660c may extend in a first direction parallel to the top surface of the second substrate 610 (Y-axis direction).

In the embodiment shown in FIG. 13, a region in which the channel structure CH and the bit line 660c are arranged may be referred to as the bit line bonding area BLBA. The bit line 660c may be electrically connected to the circuit elements 520c, which provide a page buffer 693 in the peripheral circuit region PERI, in the bit line bonding area BLBA. For example, the bit line 660c may be connected to the upper bonding metals 671c and 672c in the peripheral circuit region PERI, and the upper bonding metals 671c and 672c may be connected to the lower bonding metals 571c and 572c that are connected to the circuit elements 520c of the page buffer 693.

In the word line bonding area WLBA, the word lines 630 may extend in a second direction parallel to the top surface of the second substrate 610 (X-axis direction) and may be connected to a plurality of cell contact plugs 641 to 647

(collectively, 640). The word lines 630 and the cell contact plugs 640 may be connected to one another at pads provided by at least some of the word lines 630 extending to different lengths in the second direction. A first metal layer 650*b* and a second metal layer 660*b* may be sequentially connected to the top of the cell contact plugs 640 connected to the word lines 630. In the word line bonding area WLBA, the cell contact plugs 640 may be connected to the peripheral circuit region PERI through the upper bonding metals 671*b* and 672*b* in the cell region CELL and the lower bonding metals 571*b* and 572*b* in the peripheral circuit region PERI.

The cell contact plugs 640 may be electrically connected to the circuit elements 520*b* that provide a row decoder 694 in the peripheral circuit region PERI. In an embodiment of the inventive concept, an operating voltage of the circuit elements 520*b* providing the row decoder 694 may be different from an operating voltage of the circuit elements 520*c* providing the page buffer 693. For example, the operating voltage of the circuit elements 520*c* providing the page buffer 693 may be greater than the operating voltage of the circuit elements 520*b* providing the row decoder 694.

A common source line contact plug 680 may be provided in the external pad bonding area PA. The common source line contact plug 680 include a conductive material like a metal, a metal compound, or polysilicon and may be electrically connected to the common source line 620. A first metal layer 650*a* and a second metal layer 660*a* may be sequentially stacked on the common source line contact plug 680. For example, an area in which the common source line contact plug 680, the first metal layer 650*a*, and the second metal layer 660*a* are arranged may be referred to as the external pad bonding area PA.

Meanwhile, input/output pads 505 and 605 may be arranged in the external pad bonding area PA. A lower insulation film 501 covering the bottom surface of the first substrate 510 may be formed under the first substrate 510, and a first input/output pad 505 may be formed on the lower insulation film 501. The first input/output pad 505 is connected to at least one of the circuit elements 520*a*, 520*b*, and 520*c* arranged in the peripheral circuit region PERI through a first input/output contact plug 503 and may be separated from the first substrate 510 by the lower insulation film 501. Additionally, a side insulation film may be provided between the first input/output contact plug 503 and the first substrate 510 to electrically separate the first input/output contact plug 503 from the first substrate 510.

An upper insulation film 601 covering the top surface of the second substrate 610 may be formed on the second substrate 610, and a second input/output pad 605 may be provided on the upper insulation film 601. The second input/output pad 605 may be connected to at least one of the circuit elements 520*a*, 520*b*, and 520*c* arranged in the peripheral circuit region PERI through a second input/output contact plug 603.

According to embodiments of the inventive concept, the second substrate 610 and the common source line 620 may not be arranged in an area where the second input/output contact plug 603 is provided. Additionally, the second input/output pad 605 may not overlap the word lines 630 in the third direction (Z-axis direction). The second input/output contact plug 603 may be separated from the second substrate 610 in a direction parallel to the top surface of the second substrate 610 and may penetrate through the interlayer insulation layer 515 in the cell region CELL and be connected to the second input/output pad 605.

According to embodiments of the inventive concept, the first input/output pad 505 and the second input/output pad 605 may be selectively formed. For example, the memory device 1000 may include only the first input/output pad 505 provided on the first substrate 501 or only the second input/output pad 605 provided on the second substrate 601. Alternatively, the memory device 1000 may include both the first input/output pad 505 and the second input/output pad 605.

In each of the external pad bonding area PA and the bit line bonding area BLBA included in each of the cell region CELL and the peripheral circuit region PERI, a metal pattern of an uppermost metal layer may exist as a dummy pattern, or the uppermost metal layer may be omitted.

In the memory device 1000, in the external pad bonding area PA, in correspondence to an upper metal pattern 672*a* formed on the uppermost metal layer in the cell region CELL, a lower metal pattern 573*a* having substantially the same shape as the upper metal pattern 672*a* in the cell region CELL may be formed on the uppermost metal layer in the peripheral circuit region PERI. The lower metal pattern 573*a* formed on the uppermost metal layer in the peripheral circuit region PERI may not be connected to a separate contact in the peripheral circuit region PERI. Similarly, in the external pad bonding area PA, in correspondence to a lower metal pattern formed on the uppermost metal layer in the peripheral circuit region PERI, an upper metal pattern having substantially the same shape as the lower metal pattern in the peripheral circuit region PERI may be formed on the uppermost metal layer in the cell region CELL.

The lower bonding metals 571*b* and 572*b* may be formed on the second metal layer 540*b* in the word line bonding area WLBA. In the word line bonding area WLBA, the lower bonding metals 571*b* and 572*b* in the peripheral circuit region PERI may be electrically connected to upper bonding metals 671*b* and 672*b* in the cell region CELL through bonding. Additionally, in the bit line bonding area BLBA, in correspondence to a lower metal pattern 552 formed on the uppermost metal layer in the peripheral circuit region PERI, an upper metal pattern 692 having substantially the same shape as the metal pattern 552 may be formed on the uppermost metal layer in the cell region CELL. A contact may not be formed on the upper metal pattern 692 formed on the uppermost metal layer in the cell region CELL.

While the inventive concept has been particularly shown and described with reference to embodiments thereof, it will be understood that various changes in form and details may be made therein without departing from the spirit and scope of the inventive concept as set forth by the appended claims.

What is claimed is:

1. A method of operating a memory device that performs a plurality of program loops for a plurality of memory cells, the method comprising:
    applying a first program pulse and a first verify pulse of a first program loop from among the plurality of program loops;
    counting a first off cell count by using an output based on the first verify pulse;
    determining a first verify skip period using the first off cell count;
    applying an N-th program pulse and a plurality of verify pulses in response to an end of the first verify skip period, wherein N is a positive integer;
    counting a second off cell count by using an output based on the plurality of verify pulses; and
    determining a second verify skip period using the second off cell count.

2. The method of claim 1, wherein the first verify skip period comprises at least one loop and corresponds to a period in which only a plurality of program pulses, sequentially increasing as much as a step voltage, are applied,
a length of the first verify skip period is inversely proportional to the first off cell count,
the second verify skip period comprises at least one loop and corresponds to a period in which a plurality of program pulses, sequentially increasing as much as the step voltage, and the plurality of verify pulses are applied,
the plurality of verify pulses comprise verify pulses for remaining program states other than a completed program state, from among a plurality of program states, and
a length of the second verify skip period is inversely proportional to the second off cell count.

3. The method of claim 1, further comprising:
bypassing determination of the second verify skip period based on the second off cell count; and
increasing the step voltage for remaining program loops other than the first verify skip period, based on the second off cell count.

4. The method of claim 1, wherein the plurality of memory cells are connected to a first string select line, and wherein the method further comprises:
loading the first off cell count; and
applying the first program pulse and the first verify pulse of the first program loop to memory cells included in string select lines other than the first string select line, and
a voltage offset is added to a magnitude of the first program pulse based on the first off cell count.

5. The method of claim 1, further comprising, reprogramming to perform the plurality of program loops again, in response to termination of the plurality of program loops,
wherein the reprogramming further comprises:
loading the first off cell count;
determining a magnitude of a voltage offset using the first off cell count; and
applying the first program pulse and the first verify pulse of the first program loop, and
wherein the voltage offset is added to a magnitude of the first program pulse.

6. The method of claim 1, wherein the plurality of memory cells each correspond to at least one of a multi-level cell, a triple-level cell, or a quad-level cell.

7. The method of claim 1, further comprising:
loading at least one of program/erase cycle information, temperature information, or program order information from a look-up table; and
determining the first verify skip period and the second verify skip period based on the first off cell count, the second off cell count, and at least one of the loaded program/erase cycle information, the temperature information, or the program order information.

8. A memory device comprising:
a memory cell array comprising a plurality of memory cells; and
a control logic circuit configured to perform a plurality of program loops for the plurality of memory cells,
wherein the control logic circuit comprises an off cell counting circuit configured to identify a number of off cells based on at least one verify pulse, a verify skip period manager circuit configured to determine a length of a verify skip period based on the number of off cells or a critical value, and a step voltage manager circuit configured to determine a magnitude of a step voltage for the plurality of program loops based on the number of off cells.

9. The memory device of claim 8, wherein the control logic circuit applies a first program pulse and a first verify pulse in a first program loop of the plurality of program loops, counts a number of first off cells by using an output based on the first verify pulse, determines a first verify skip period based on the number of first off cells, applies an N-th program pulse and a plurality of verify pulses in response to termination of the first verify skip period, counts a number of second off cells by using an output based on the plurality of verify pulses, and determines a second verify skip period based on the number of second off cells wherein N is a positive integer.

10. The memory device of claim 9, wherein the control logic circuit is configured to bypass the determination of the second verify skip period based on the number of the second off cells, and to increase a step voltage level for program loops other than the first verify skip period from among the plurality of program loops, based on the number of the second off cells.

11. The memory device of claim 9, wherein the plurality of memory cells are connected to a first string select line,
the control logic circuit is configured to load the number of the first off cells and to apply the first program pulse and the first verify pulse of the first program loop to memory cells included in string select lines other than the first string select line, and
a voltage offset is added to a magnitude of the first program pulse based on the number of the first off cells.

12. The memory device of claim 9, wherein the control logic circuit is configured to perform reprogramming of the plurality of program loops again in response to termination of the plurality of program loops,
in the reprogramming, the control logic circuit loads the number of the first off cells, determines a magnitude of a voltage offset based on the number of the first off cells, and applies the first program pulse and the first verify pulse of the first program loop, and
the voltage offset is added to a magnitude of the first program pulse.

13. The memory device of claim 8, wherein the plurality of memory cells each correspond to at least one of a multi-level cell, a triple-level cell, or a quad-level cell.

14. The memory device of claim 8, wherein the control logic circuit further comprises a look-up table configured to store at least one of program/erase cycle information, temperature information, or program order information, and a mapping result according to the number of off cells.

15. The memory device of claim 14, wherein the control logic circuit loads at least one of the program/erase cycle information, temperature information, or program order information from the look-up table, and determines the verify skip period based on the number of off cells and at least one of the program/erase cycle information, the temperature information, or the program order information.

16. A memory device comprising:
a memory cell region comprising a first metal pad;
a peripheral circuit region comprising a second metal pad and configured to be connected in a vertical direction to the memory cell region through the first metal pad and the second metal pad;
a memory cell array including a plurality of memory cells including a plurality of strings extending in the vertical direction with respect to a substrate in the memory cell region; and a control logic circuit configured to apply a first program pulse and a first verify pulse in a first program loop of a plurality of program loops in the peripheral circuit region, count a number of first off cells by using an output based on the first verify pulse, determine a first verify skip period based on the number of first off cells, apply an N-th program pulse and a plurality of verify pulses in response to termination of the first verify skip period, count a number of second off cells by using an output based on the plurality of verify pulses, and determine a second verify skip period based on the number of second off cells, wherein N is a positive integer.

17. The memory device of claim 16, wherein the control logic circuit comprises:
  an off cell counting circuit configured to identify a number of off cells based on at least one verify pulse;
  a verify skip period manager circuit configured to determine a length of the first verify skip period and a length of the second verify skip period; and
  a step voltage manager circuit configured to determine a step voltage level for remaining program loops other than the first verify skip period from among the plurality of program loops, based on the number of second off cells.

18. The memory device of claim 16, wherein the plurality of memory cells are connected to a first string select line, the control logic circuit is configured to load the number of the first off cells and to apply the first program pulse and the first verify pulse of the first program loop to memory cells included in string select lines other than the first string select line, and
  a voltage offset is added to a magnitude of the first program pulse based on the number of the first off cells.

19. The memory device of claim 16, wherein the control logic circuit is configured to bypass the determination of the second verify skip period based on the number of the second off cells, and to increase a step voltage level for program loops other than the first verify skip period from among the plurality of program loops, based on the number of the second off cells.

20. The memory device of claim 16, wherein the control logic circuit is configured to perform reprogramming of the plurality of program loops again in response to termination of the plurality of program loops,
  in the reprogramming, the control logic circuit loads the number of the first off cells, determines a magnitude of a voltage offset based on the number of the first off cells, and applies the first program pulse and the first verify pulse of the first program loop, and
  the voltage offset is added to a magnitude of the first program pulse.

* * * * *